United States Patent
Lee et al.

(10) Patent No.: US 7,791,936 B2
(45) Date of Patent: *Sep. 7, 2010

(54) MULTIBIT ELECTRO-MECHANICAL MEMORY DEVICE AND METHOD OF MANUFACTURING THE SAME

(75) Inventors: Ji-Myoung Lee, Yongin-si (KR); Min-Sang Kim, Seoul (KR); Eun-Jung Yun, Seoul (KR); Sung-Young Lee, Yongin-si (KR); In-Hyuk Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 67 days.

This patent is subject to a terminal disclaimer.

(21) Appl. No.: 12/074,645

(22) Filed: Mar. 5, 2008

(65) Prior Publication Data

US 2008/0219048 A1 Sep. 11, 2008

(30) Foreign Application Priority Data

Mar. 8, 2007 (KR) ...................... 10-2007-0022888

(51) Int. Cl.
*G11C 11/50* (2006.01)
(52) U.S. Cl. ............. 365/164; 365/185.13; 365/185.26; 365/185.27
(58) Field of Classification Search ................ 365/164, 365/185.13, 185.26, 185.27
See application file for complete search history.

(56) References Cited

U.S. PATENT DOCUMENTS

| | | | |
|---|---|---|---|
| 5,774,414 A | 6/1998 | Melzner et al. | |
| 6,054,745 A | 4/2000 | Nakos et al. | |
| 6,100,109 A | 8/2000 | Melzner et al. | |
| 6,473,361 B1 * | 10/2002 | Chen et al. | 365/244 |
| 6,625,047 B2 * | 9/2003 | Coleman, Jr. | 365/51 |
| 6,750,742 B2 | 6/2004 | Kang et al. | |

(Continued)

FOREIGN PATENT DOCUMENTS

JP 2000-31397 1/2000

(Continued)

OTHER PUBLICATIONS

Decision of Grant issued on Sep. 23, 2008 in related Korean Application No. Oct. 10-2007-0050226.

(Continued)

*Primary Examiner*—Pho Miner Luu
(74) *Attorney, Agent, or Firm*—Mills & Onello, LLP

(57) ABSTRACT

A multibit electro-mechanical memory device and a method of manufacturing the same include a substrate, a bit line on the substrate; a lower word line and a trap site isolated from the bit line, a pad electrode isolated from a sidewall of the trap site and the lower word line and connected to the bit line, a cantilever electrode suspended over a lower void in an upper part of the trap site, and connected to the pad electrode and curved by an electrical field induced by a charge applied to the lower word line, a contact part for concentrating a charge induced from the cantilever electrode thereon in response to the charge applied from the lower word line and the trap site, the contact part protruding from an end part of the cantilever electrode, and an upper word line formed with an upper void above the cantilever electrode.

20 Claims, 21 Drawing Sheets

U.S. PATENT DOCUMENTS

| | | | |
|---|---|---|---|
| 7,071,023 | B2 | 7/2006 | Bertin et al. |
| 7,122,942 | B2 | 10/2006 | Song et al. |
| 2005/0037547 | A1 | 2/2005 | Bertin et al. |
| 2005/0230271 | A1 | 10/2005 | Levon et al. |
| 2005/0279988 | A1 | 12/2005 | Bertin |
| 2006/0128046 | A1 | 6/2006 | Onishi |
| 2006/0166393 | A1 | 7/2006 | Ha et al. |
| 2006/0181630 | A1 | 8/2006 | Shioji et al. |
| 2007/0015303 | A1 | 1/2007 | Bertin et al. |
| 2008/0048246 | A1 | 2/2008 | Yun et al. |
| 2008/0137404 | A1 | 6/2008 | Park |
| 2008/0144364 | A1 | 6/2008 | Lee et al. |
| 2008/0185668 | A1* | 8/2008 | Kim et al. .................. 257/415 |
| 2008/0198649 | A1 | 8/2008 | Park |
| 2008/0219048 | A1 | 9/2008 | Lee et al. |
| 2009/0053846 | A1 | 2/2009 | Rueckes et al. |
| 2009/0072296 | A1* | 3/2009 | Lee et al. .................. 257/324 |
| 2009/0072297 | A1* | 3/2009 | Lee et al. .................. 257/324 |
| 2009/0097315 | A1* | 4/2009 | Yun et al. ............... 365/185.13 |
| 2009/0115009 | A1* | 5/2009 | Lee et al. .................. 257/415 |
| 2010/0038731 | A1 | 2/2010 | Van Kampen et al. |

FOREIGN PATENT DOCUMENTS

| | | |
|---|---|---|
| JP | 200463605 | 2/2004 |
| KR | 1020010032068 | 4/2001 |
| KR | 1020010107918 | 12/2001 |
| KR | 100417481 | 1/2004 |
| KR | 1020040035678 | 4/2004 |
| KR | 100434369 | 5/2004 |
| KR | 1020060085426 | 7/2006 |
| KR | 100621827 | 9/2006 |

OTHER PUBLICATIONS

Decision of Grant issued on Sep. 29, 2008 in related Korean Application No. Oct. 10-2007-0050223.

* cited by examiner

PROGRAM"0"

READ"0"

PROGRAM"1"

READ"1"

MULTIBIT ELECTRO-MECHANICAL MEMORY DEVICE AND METHOD OF MANUFACTURING THE SAME

CROSS REFERENCE TO RELATED APPLICATIONS

This application claims priority under 35 U.S.C. §119 from Korean Patent Application 10-2007-0022888, filed on Mar. 8, 2007, the contents of which are hereby incorporated by reference in their entirety for all purposes as if fully set forth herein.

FIELD OF THE INVENTION

The present invention relates to semiconductor memory devices and a method of manufacturing the same. More particularly, the present invention relates to a multibit electro-mechanical memory device and a method of manufacturing the same, for programming and reading data through the switching operation of plural cantilever electrodes formed symmetrically relative to a trench.

BACKGROUND OF THE INVENTION

Typically, a memory device that stores data is largely classified as either a volatile semiconductor memory device or a nonvolatile semiconductor memory device. The volatile memory device principally represented as a DRAM (Dynamic Random Access Memory) or a SRAM (Static Random Access Memory), etc. is fast with regard to the input/output operation of data, but has a shortcoming in that stored contents are lost when a power supply is stopped. The nonvolatile memory device principally represented as EPROM (Erasable Programmable Read Only Memory) or EEPROM(Electrically Erasable Programmable Read Only Memory), etc. is slow with regard to the input/output operation of data, but has the benefit of maintaining the stored data intact even when a power supply is interrupted.

A conventional memory device is commonly employing a MOSFET (Metal Oxide Semiconductor Field Effect Transistor) based-memory. For example, a stack gate-type transistor memory device of a stack structure adapted on a semiconductor substrate formed of silicon material, and a trench gate type transistor memory device having a structure buried in the inside of the semiconductor substrate, are under development. However, a width and length of channel in the MOSFET must be formed with a sufficient length to suppress a short-channel effect. Further, a thickness of a gate insulation layer formed between a gate electrode formed on the channel and the semiconductor substrate must be extremely thin. Due to this fundamental problem, there is a difficulty to realize a memory device having a nano-level ultra microstructure for the MOSFET.

Memory devices of the structure to replace the MOSFET with new ones are under active research. Recently, micro electromechanical system (MEMS) and nano electromechanical system (NEMS) technology applied to suspend bridge memory (SBM) has been represented. An example of a nonvolatile memory device using the MEMS technology is disclosed in U.S. Pat. No. 6,054,745, incorporated herein by reference.

FIG. 1 is a sectional view schematically showing a conventional memory device.

As shown in FIG. 1, a conventional memory device is obtained by forming an FET (Field Effect Transistor) sensor 221, attractive electrode part 223, and cantilever electrode supporter 225, to be distinguished from one another, on a shallow trench isolation(STI) 224 formed on a substrate 222. A cantilever electrode 240 is further formed of a type such that one side of the cantilever electrode 240 is supported by, and electrically connected to, the cantilever electrode supporter 225, wherein the cantilever electrode 240 is distanced by a predetermined height from the attractive electrode part 223 and the FET sensor 221. The cantilever electrode 240 is formed so as to be curved toward the attractive electrode 232 by an electric field induced by the attractive electrode part 223. Then, even when the electric field induced by the attractive electrode part 223 is eliminated, the cantilever electrode 240 can maintain its curved state by an electric field induced from electrons captured by a polysilicon gate electrode 230 of the FET sensor 221. For example, the polysilicon gate electrode 230 corresponds to a floating electrode of a flash memory device, which captures electrons that tunnel through a tunnel oxide layer that is formed of a dielectric formed on a source-drain region 227 of the FET sensor 221. The attractive electrode part 223 and the cantilever electrode supporter 225 are formed of the same polysilicon material as the polysilicon gate electrode 230. The cantilever electrode 240 is also formed of polysilicon material like the cantilever electrode supporter 225.

That is, in a conventional memory device, a nonvolatile memory device can include an attractive electrode 232 for curving the cantilever electrode 240 by an electromagnetic force, and an FET sensor 221 including the gate electrode 230 for maintaining the curved state of the cantilever electrode 240, in a lower part of the cantilever electrode 240.

However, a conventional memory device has the following problems.

In the conventional memory device, a high voltage must be applied between the cantilever electrode 240 and the attractive electrode 232 so as to endure tension of the cantilever electrode 240 supported by the cantilever electrode supporter 225, in permitting contact between the cantilever electrode 240 and the attractive electrode 232.

Further, in the conventional memory device, the cantilever electrode supporter 225 and the FET sensor 221 are formed in parallel at the same level. Thus, it is difficult to arrange a matrix type cell array and so there is a shortcoming in that an integration of memory devices decreases.

Further, in the conventional memory device, the attractive electrode part 223 causes the cantilever electrode 240 of a horizontal state to be curved, and the FET sensor 221 maintains the curved state of the cantilever electrode 240 that is curved by the attractive electrode part 223. Thus, the attractive electrode part 223 and FET sensor 221 must be configured on the same horizontal face, but separately from each other, and the cantilever electrode 240 must be formed long to cover the upper part of the attractive electrode part 223 and the FET sensor 221. Therefore, a limitation exists with regard to a decrease in integration of memory devices.

Further, in the conventional memory device, data of only 1 bit is programmed or read out per single unit cell comprising the cantilever electrode 240, attractive electrode 232 and FET sensor 221, and thus, it is difficult to store multibit data.

SUMMARY OF THE INVENTION

Accordingly, some embodiments of the invention provide a multibit electro-mechanical memory device and method of manufacturing the same, which is capable of reducing a power consumption by performing a switching operation in a low voltage state. An integrated level of memory devices may increase at most by forming, in the same direction, a cantilever electrode and a bit line applying a charge to the cantilever electrode and so configuring a matrix type cell array. Further, the integrated level of memory devices can increase or increase at most by reducing a length of the cantilever electrode and by unifying an attractive electrode contacted with the cantilever electrode and the FET sensor. In addition, data of 2 bits or more for one unit cell can be input/output.

In an aspect, a memory device comprises a substrate having a flat face, a bit line formed in a first direction on the substrate, a lower word line and a trap site that are isolated from the bit line and formed in a second direction intersecting the first direction, a pad electrode electrically isolated from a sidewall of the trap site and the lower word line and connected to the bit line, a cantilever electrode suspended in the first direction above a lower void and an upper part of the trap site, and connected to the pad electrode and curved in a third direction that is vertical with respect to the first and second direction by an electrical field induced by a first charge applied to the lower word line, a contact part that concentrates a second charge induced from the cantilever electrode in response to the first charge applied to the lower word line and the trap site, the contact part protruding from an end part of the cantilever electrode, the contact part having a thickness in the third direction so as to reduce a curved distance of the cantilever electrode in the lower void, and an upper word line formed in the second direction with an upper void above the cantilever electrode.

In an embodiment, the contact part comprises a contact point extending from the end part of the cantilever electrode, the contact point in contact with the trap site or in electrical contact with the upper word line.

In an embodiment, the pad electrode is electrically isolated from the lower word line and the trap site by a second interlayer insulating film having a contact hole that extends along a sidewall of the lower word line and the trap site such that the bit line is selectively exposed by the contact hole.

In another aspect, a multibit electromechanical memory device comprises a substrate having a flat face, a bit line formed in a first direction on the substrate, a first interlayer insulating film formed on the bit line, first and second lower word lines and first and second trap sites that are formed in a second direction intersecting the bit line on the first interlayer insulating film and that are separated from each other respectively by a trench formed in the second direction, a second interlayer insulating film covering sides of the first and second lower word lines and the first and second trap sites, the first and second lower word lines and the first and second trap sites being opposite each other by the trench, a pad electrode in a contact hole, the contact hole being formed by removing the second interlayer insulating film provided on the sides of the first and second lower word lines and the first and second trap sites, the contact hole exposing the bit line, first and second cantilever electrodes supported in the first direction by the second interlayer insulating film and the pad electrode, and suspended above first and second lower voids on the first and second lower word lines, and separated from each other by the trench, the first and second cantilever electrodes being curved in a third direction vertical with respect to the first and second direction by an electrical field induced by a first charge applied to the first and second lower word lines, first and second contact parts that concentrate a second charge induced from the first and second cantilever electrodes in response to the first charge applied to the first and second lower word lines and the first and second trap sites, the first and second contact parts protruding from end parts of the first and second cantilever electrodes having a thickness in the third direction so as to reduce a curved distance of the first and second cantilever electrodes in a given condition, a third interlayer insulating film formed on the first and second cantilever electrodes corresponding to the pad electrode, and first and second upper word lines supported by the third interlayer insulating film and formed in the second direction with first and second upper voids above the first and second cantilever electrodes.

In an embodiment, the first and second contact parts comprise a contact point extending from the end parts of the first and second cantilever electrodes, respectively, the contact points in electrical contact with the first and second trap sites or the first and second upper word lines.

In an embodiment, the first and second trap sites have a stack structure of first silicon oxide layer, silicon nitride layer and second silicon oxide layer.

In an embodiment, the first and second cantilever electrodes contain at least one of titanium, titanium nitride and carbon nanotube.

In an embodiment, first and second spacers are formed in a second direction on the sides of the first and second trap sites and the first and second lower word lines opposite each other on the trench.

In an embodiment, the first and second spacers are exposed to the contact hole in an upper part of the bit line, and sidewalls of the first and second spacers are covered, except portions of the spacers corresponding to an upper part of the bit line, with the second interlayer insulating film.

In an embodiment, the trench is formed in the second direction intersected to the bit line, exposing an upper part of the first interlayer insulating film thereto.

In an embodiment, a fourth interlayer insulating film is formed to seal the trench from an upper end of the trench.

In another aspect, a method of manufacturing a multibit electro-mechanical memory device comprises forming a bit line in a first direction on a substrate, forming a stack comprising a first interlay insulating film, lower word line, trap site, first sacrifice layer and first dummy sacrifice layer in a second direction intersecting the bit line; forming a second interlayer insulating film on a sidewall of the stack, the second interlay insulating film having a contact hole in which the bit line is exposed, forming a pad electrode in the contact hole, forming a cantilever electrode connected in the first direction to an upper part of the first sacrifice layer on the pad electrode and the second interlayer insulating film, forming a second dummy sacrifice layer on the cantilever electrode and the second interlayer insulating film, removing the second dummy sacrifice layer, cantilever electrode, and first dummy sacrifice layer adapted in the pad electrode and so forming a dimple to which the first sacrifice layer is exposed, filling in the dimple to form a contact part that is electrically connected to the cantilever electrode, forming a second sacrifice layer and an upper word line in a second direction on the stack formed on the contact part, cantilever electrode and second interlayer insulating film, forming a third interlayer insulating film surrounding a sidewall of the second sacrifice layer and the upper word line, removing the upper word line, second sacrifice layer, second dummy sacrifice layer, cantilever electrode, first dummy sacrifice layer, first sacrifice layer, trap site and lower word line in the second direction, and thus forming a trench to which the first interlayer insulating film is exposed from the bottom thereof, removing the first sacrifice layer and the second sacrifice layer exposed to the trench, and forming voids in upper and lower parts of the cantilever electrode.

In an embodiment, the contact part is formed by forming a conductive metal layer of a thickness or carbon nanotube on the second dummy sacrifice layer including the dimple and then by removing the conductive metal layer or the carbon nanotube to be planarized to expose the second dummy sacrifice layer.

In an embodiment, the second interlayer insulating film is formed by forming a silicon oxide layer burying the stack and removing the silicon oxide layer to be planarized so as to expose the first sacrifice layer, and by removing the silicon oxide layer formed on the bit line and adapted in the stack, to form the contact hole to which the bit line is selectively exposed in both sides of the stack.

In an embodiment, the pad electrode is formed by forming a conductive metal or polysilicon filling in the contact hole and by removing the conductive metal or polysilicon to be planarized to expose the first dummy sacrifice layer and the second interlayer insulating film.

In an embodiment, the cantilever electrode formed on the pad electrode, second interlayer insulating film and first dummy sacrifice layer is formed with the same or similar line width to the bit line in an upper part of the bit line.

In an embodiment, when the first and second dummy sacrifice layers are formed of silicon germanium material and the first and second sacrifice layers are formed of polysilicon material, the polysilicon is isotropically etched and eliminated by a wet or dry etching method.

In an embodiment, an isotropy etchant solution used for the wet etching method contains a mixture solution obtained by mixing nitric acid, HF and acetic acid with deionized water by a density, and isotropy reactive gas used for the dry etching method contains gas of FC-group formed of $CF_4$ or $CHF_3$.

In an embodiment, a dummy trench is formed to expose the trap site from the bottom thereof by eliminating the upper word line, second sacrifice layer, second dummy sacrifice layer, cantilever electrode, first dummy sacrifice layer and first sacrifice layer, voids are formed in upper and lower parts of the cantilever electrode by removing the first dummy sacrifice layer, second dummy sacrifice layer, first sacrifice layer and second sacrifice layer whose sidewalls are exposed to the dummy trench, and the trench is formed to expose the first interlayer insulating film from the bottom thereof by removing the lower word line and the trap site exposed to the bottom of the dummy trench.

In an embodiment, a fourth interlayer insulating film is formed for shielding an upper end of the trench to seal the trench.

BRIEF DESCRIPTION OF THE DRAWINGS

The above and other features and advantages of the present invention will become more apparent to those of ordinary skill in the art by describing in detail preferred embodiments thereof with reference to the attached drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION

The present invention now will be described more fully hereinafter with reference to FIGS. 2 to 21, in which embodiments are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 21. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

The thickness of several layers and regions shown referring to the accompanied drawings are just for the clarity in the description of the invention. In addition, in the following description referred to as "existing/adapted/formed 'on' a layer or substrate," it may indicate that it is directly contacted with other layer or substrate or that a third layer is interposed therebetween.

Figure 1:
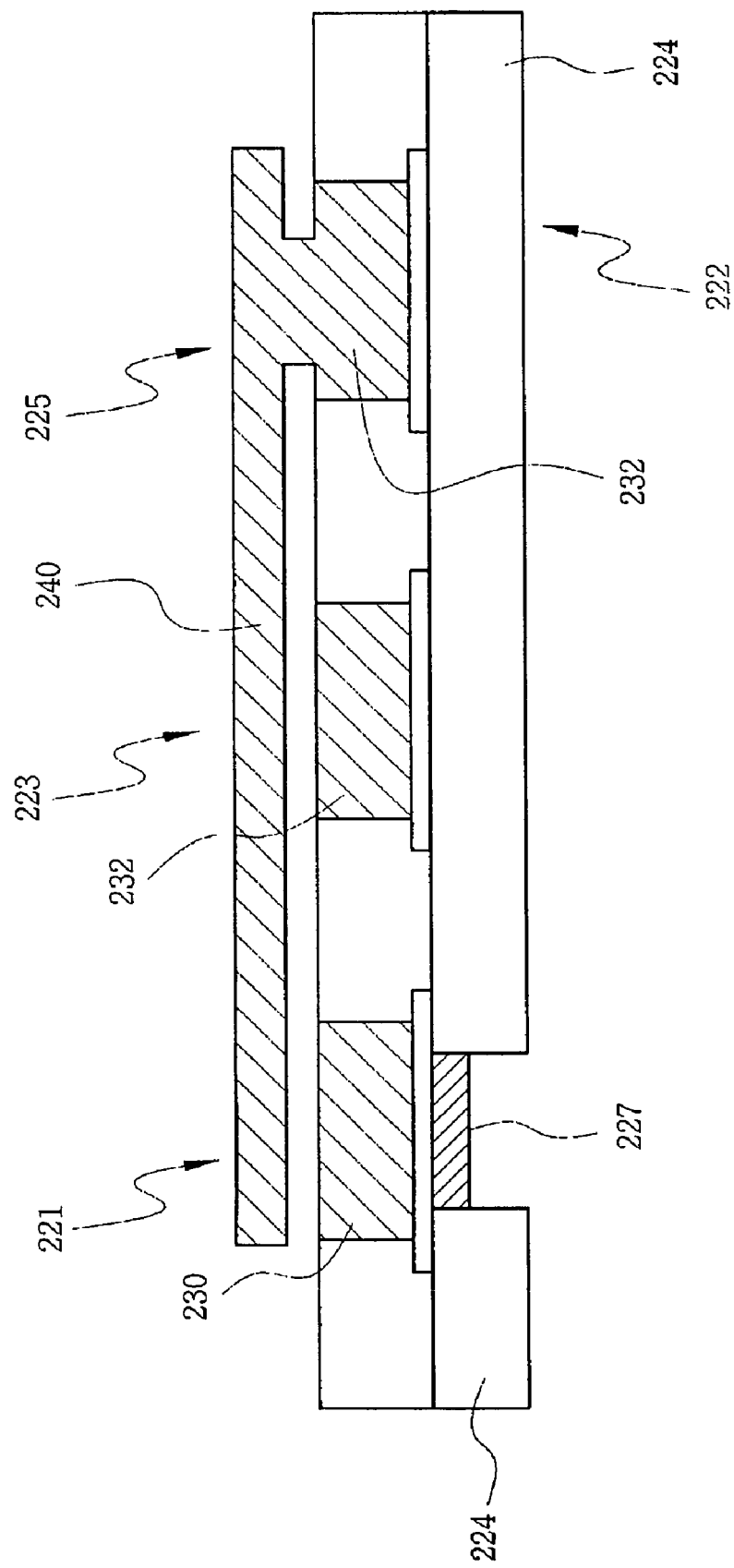
FIG. 1 is a sectional view schematically illustrating a conventional memory device.
Figure 2:
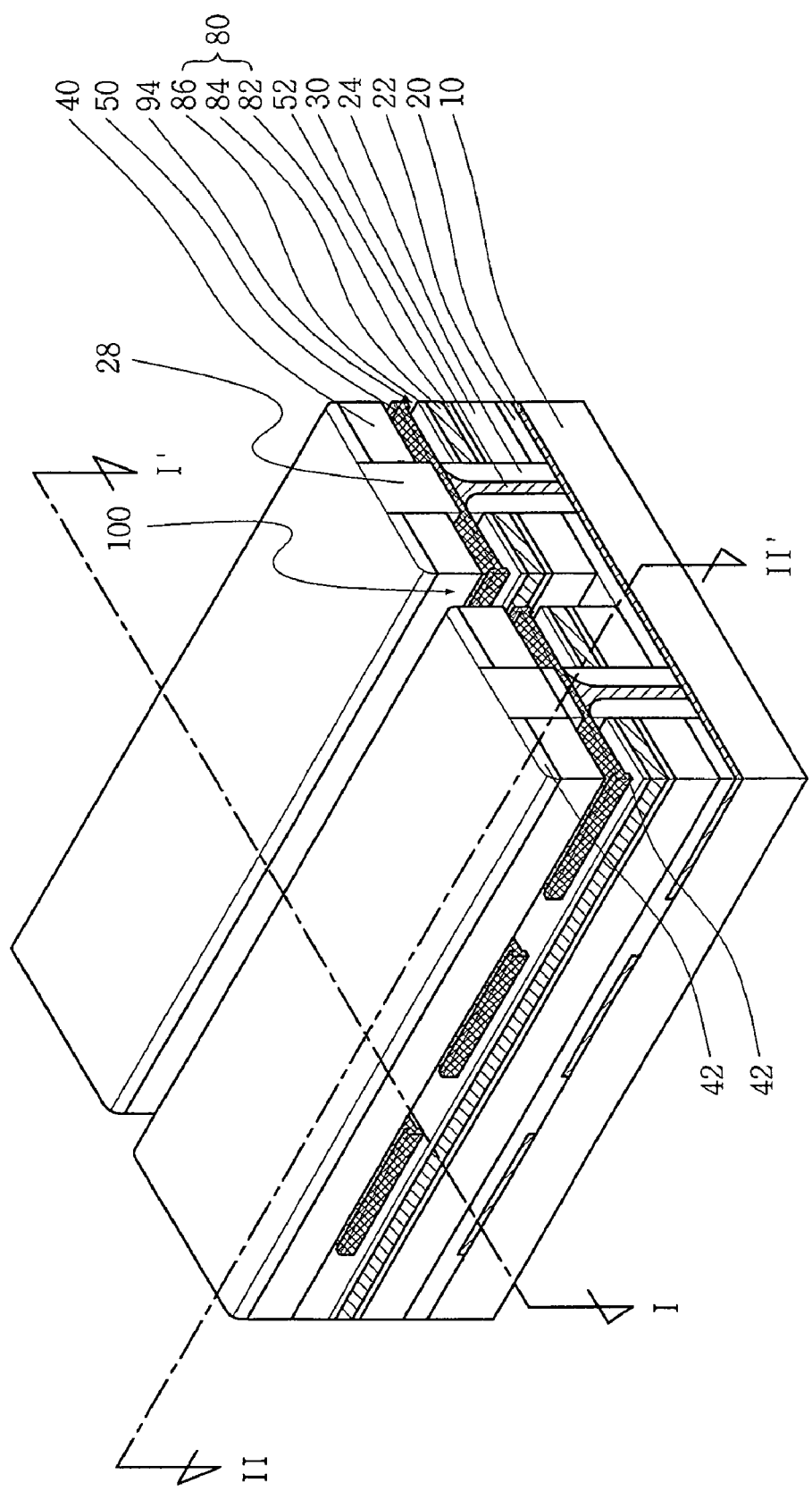
FIG. 2 is a perspective view of a multibit electromechanical memory device according to an embodiment of the invention.
Figure 3:
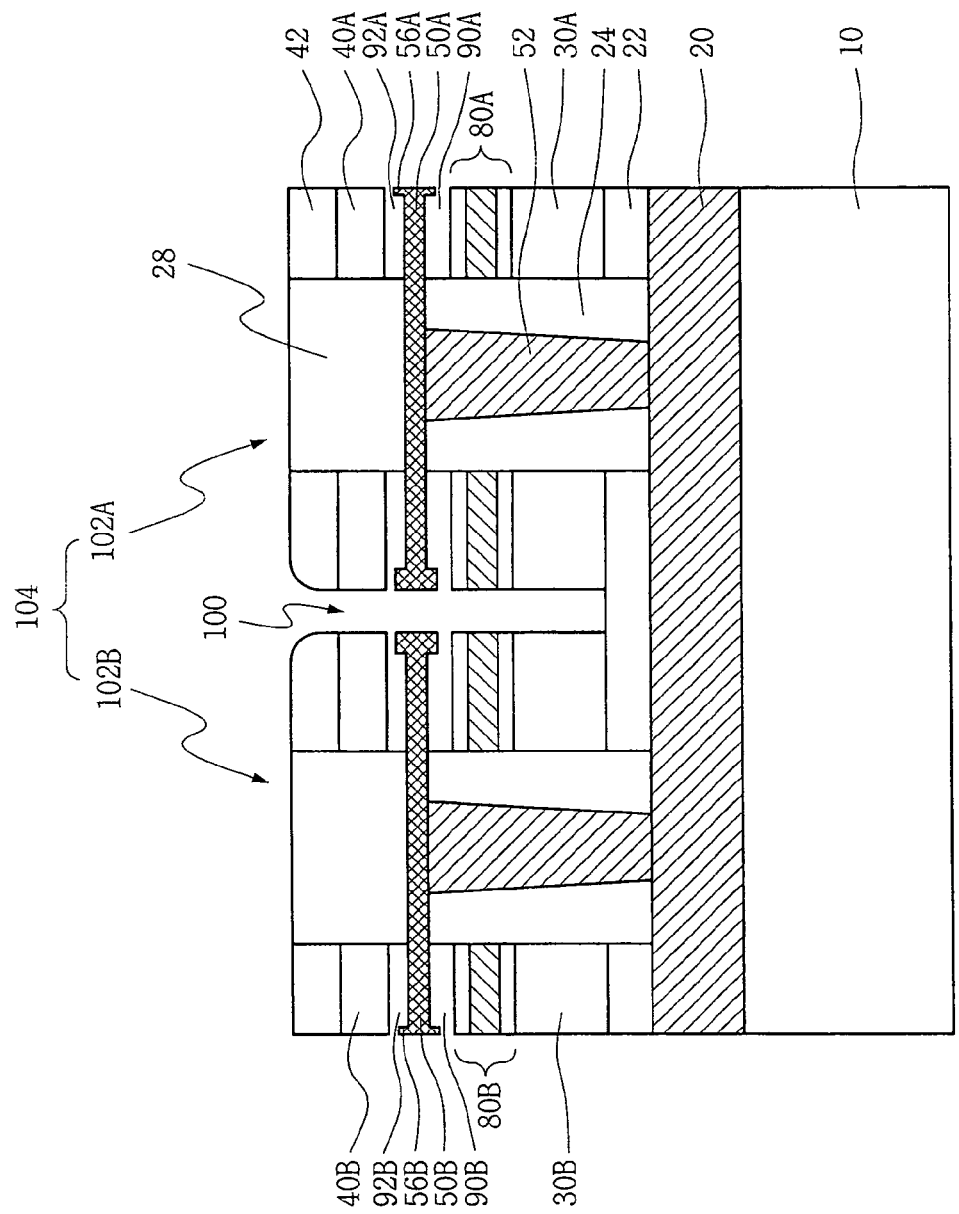
FIG. 3 is a sectional view taken along a line I-I' of FIG. 2.

FIG. 2 is a perspective view of a multibit electromechanical memory device according to an embodiment of the invention. FIG. 3 is a sectional view taken along a line I-I' of FIG. 2.

Referring to FIGS. 2 and 3, a plurality of bit lines 20 are formed in a first direction on a substrate 10 of a given flat face. For example, the substrate 10 is formed including an insulation substrate having a certain degree of flexibility or a semiconductor substrate. The plurality of bit lines 20 are formed including at least one of conductive metal material, and crystal silicon or polysilicon material doped with a conductive impurity, the conductive metal material including at least one of gold, silver, copper, aluminum, tungsten, tungsten silicide, titanium, titanium nitride, tantalum, tantalum silicide, or other conductive metal materials known to those of skill in the art. A first interlayer insulating film 22 is formed on the plurality of bit lines 20. For example, the first interlayer insulating film 22 is a dielectric of electrically insulating the bit line 20, and is formed containing silicon oxide or silicon oxide nitride.

First and second lower word lines 30A and 30B are horizontally separated from each other and first and second trap sites 80A and 80B, are horizontally separated from each other by a trench 100, and are formed in the second direction on the first interlayer insulating film 22. The first lower word line 30A and the second lower word line 30B are insulated from the substrate 10 and the plurality of bit lines 20 from the first interlayer insulating film 22. Thus, an electric signal can be applied thereto freely from the bit lines 20. For example, the first and second lower word lines 30A and 30B may be formed of prominent conductive metal material, i.e., gold, silver, copper, aluminum, tungsten, tungsten silicide, titanium, titanium nitride, tantalum, tantalum silicide, or other conductive metal materials known to those of skill in the art, similar to materials of the bit line 20. In the first and second trap sites 80A and 80B, a charge applied through the first and second lower word lines 30A and 30B is tunneled inside thereof and is trapped therein so that the trapped charge can be always held even when there is no charge applied from the outside. In an embodiment, the first and second trap sites 80A and 80B have a thin film of 'ONO(Oxide-Nitride-Oxide)' structure, the ONO structure including a first silicon oxide 82 formed on the first and second lower word lines 30A and 30B, and further including silicon nitride 84 and second silicon oxide 86 stacked on each other.

A second interlayer insulating film 24 or spacer (not shown) that electrically insulates between the first and second lower word lines 30A and 30B and the first and second trap sites 80A and 80B is formed in the second direction in an external sidewall opposite an inner sidewall of the first and second lower word lines 30A and 30B and the first and second trap sites 80A and 80 exposed by the trench 100. The second interlayer insulating film 24 may be formed against sidewalls of the first and second lower word lines 30A and 30B and the first and second trap sites 80A and 80B so as to be the same height as, or similar in height to, the first and second trap sites 80A and 80B. The spacer may be selectively formed on sidewalls of the first and second lower word lines 30A and 30B and the first and second trap sites 80A and 80B. Even though the spacer is selectively formed on the sidewalls of the first and second lower word lines 30A and 30B and the first and second trap sites 80A and 80B, the second interlayer insulating film 24 must be formed in the upper part of the bit line 20 and the substrate 10 exposed to the spacer, so as to contribute to a formation of first and second cantilever electrodes 50A and 50B, described below. For example, the second interlayer insulating film 24 or spacer is formed containing silicon nitride layer or silicon oxide nitride layer. In an embodiment, the second interlayer insulating film 24 or spacer can be formed to protrude higher than a level of the first and second trap sites 80A and 80B. A contact hole (for example, element 54 shown in FIG. 11) may be formed to expose the bit line 20, by removing the second interlayer insulating film 24 or spacer (not shown) in the center between an external sidewall of the first lower word line 30 and the first trap site 80A and an external sidewall of the second lower word line 30B and the second trap site 80B. A pad electrode 52 electrically connected to the bit line 20 is formed inside the contact hole 54. The contact hole 54 may be formed by selectively removing at least a portion of the second interlayer insulating film 24 formed on the bit line 20 at a mutual intersection portion of the second interlayer insulating film 24 or spacer formed in a second direction and the bit line 20 formed in a first direction. The pad electrode 52 is formed having the same height as, or a similar height as, the first and second trap sites 80A and 80B, and is insulated by the second interlayer layer 24 or spacer from the first and second lower word lines 30A and 30B and the first and second trap sites 80A and 80B. For example, the pad electrode 52 includes at least one of conductive metal material having a prominent conduction, and crystal silicon or polysilicon material doped with conductive impurity, like the bit line 20. The conductive metal material can be formed of at least one of gold, silver, copper, aluminum, tungsten, tungsten silicide, titanium, titanium nitride, tantalum, and tantalum silicide, or other conductive metal material known to those of skill in the art.

A first cantilever electrode 50A and a second cantilever electrode 50B are formed in a first direction, i.e., X-axis direction, such that the pad electrode 52 is interposed therebetween. The first and second cantilever electrodes 50A and 50B are suspended over first and second lower voids 90A and 90B, which are formed on the first and second trap sites 80A and 80B. The first and second cantilever electrodes 50A and 50B are supported by the pad electrode 52, and the second interlayer insulating film 24 or spacer (not shown) formed in both sides of the pad electrode 52. In a multibit electromechanical memory device according to an embodiment of the invention, first and second lower word lines 30A and 30B are is formed in second direction intersecting the bit line 20 in the upper part of the bit line 20 formed in the first direction, and the cantilever electrode 50 is formed in the same first direction as the bit line 20, thereby configuring a matrix type cell array and so increasing an integrated level at most. In an embodiment, the first and second cantilever electrodes 50A and 50B can be curved in a direction of the first and second trap sites 80A and 80B by an electrostatic force generated by an electric field that is induced in the first and second lower voids 90A and 90B. That is, when given an amount of charge having mutually different polarities that is applied between the first and second cantilever electrodes 50A and 50B and the first and second lower word lines 30A and 30B, the first and second cantilever electrodes 50A and 50B may be curved by an electrostatic force corresponding to an attractive force, in a third direction, i.e., Z-axis direction.

First and second contact parts 56A and 56B protrude from end parts of the cantilever electrodes 50A, 50B, respectively. The contact parts 56A, 56B have a predefined thickness in a third direction relative to side end parts of the first and second cantilever electrodes 50A, 50B with the pad electrode 52 interposed therebetween. The first and second contact parts 56A and 56B are formed to shorten a distance that the first and second cantilever electrodes 50A and 50B are each curved in the third direction. For example, the first and second cantilever electrodes 50A and 50B can be each curved within the first and second voids 90A and 90B having a distance that is deducted by the protruded length of the first and second contact parts 56A and 56B projecting in the third direction. At this time, the first and second contact parts 56A and 56B can concentrate charges induced from the first and second cantilever electrodes 50A and 50B thereon in response to a charge applied from the first and second lower word lines 30A and 30B and the first and second trap sites 80A and 80B. That is, the first and second contact parts 56A and 56B can reduce each switching distance of the first and second cantilever electrodes 50A and 50B that are curved and switched within the first and second lower voids 90A and 90B.

Accordingly, in a multibit electromechanical memory device according to an embodiment of the invention, contact parts 56A, 56B are formed at ends of the first and second cantilever electrodes 50A and 50B, which are each coupled to the pad electrode 52, and each of which are supported by a second interlayer insulating film 24 formed in the periphery of the pad electrode 52. Further, the first and second contact parts 56A and 56B are each protrude from the cantilever electrodes 50A, 50B, which are in the first direction, the contact parts 56A, 56B having a predefined thickness in the third direction, thereby reducing a switching distance of the first and second cantilever electrodes 50A and 50B and reducing power consumption since the first and second cantilever electrodes 50A and 50B can be switched at a low voltage state.

On the other hand, the charge applied to the first and second lower word lines 30A and 30B can be tunneled and captured in the first and second trap sites 80A and 80B. Even when the charge applied to the first and second lower word lines 30A and 30B and to the first and second cantilever electrodes 50A and 50B is eliminated, the first and second cantilever electrodes 50A and 50B are maintained in a curved state, intact under the state in which the first and second contact parts 56A and 56B are in direct physical contact with the first and second trap sites 80A and 80B, by an electrical field induced by the charge captured by the first and second trap sites 80a and 80B. This is why the charge having a polarity opposed to the charge captured by the first and second trap sites 80A and 80B is concentrated and induced to the first and second contact parts 56A and 56B formed from the end part of the first and second cantilever electrodes 50A and 50B, and the first and second contact parts 56A and 56B are each in contact with the first and second trap sites 80A and 80B by an electrostatic attractive force, thereby maintaining the curved state of the first and second cantilever electrodes 50A and 50B. Accordingly, first and second trap sites 80A and 80B, in which a charge applied through first and second lower word lines 30A and 30B is tunneled and captured, are employed herein; thus, even when a charge applied to the first and second lower word lines 30A and 30B and the first and second cantilever electrodes 50A and 50B is eliminated, a curved state of the first and second cantilever electrodes 50A and 50B is maintained, thereby realizing a nonvolatile memory device.

To curve the first and second cantilever electrodes 50A and 50B in a third direction and maintain the curved state, the first and second lower word lines 30A and 30B to which a first charge is applied, and the first and second trap sites 80A and 80B, are stacked. Therefore, the length of first and second cantilever electrodes 50A and 50B is less than that of conventional cantilever electrodes. Further, an electrical contact portion and attractive portion of the conventional art can be unified according to an embodiment of the invention by employing the first and second contact parts 56A and 56B formed from an end part of the first and second cantilever electrodes 50A and 50B, to which a second charge is induced and concentrated in response to the first charge applied to the first and second lower word lines 30A and 30B and the first and second trap sites 80A and 80B. Thus, an integrated level of memory devices can be, increased.

Meanwhile, when the charge is not applied to the first and second trap sites 80A and 80B, or a charge having the same polarity is applied between the first and second cantilever electrodes 50A and 50B, and the first and second trap sites 80A and 80B, the first and second contact parts 56A and 56B formed from the end part of the first and second cantilever electrodes 50A and 50B can be separated from the first and second trap sites 80A and 80b by an electrostatic force corresponding to a repulsive force. In an embodiment, the first and second cantilever electrodes 50A and 50B are formed of titanium, titanium nitride or carbon nanotube material. Similarly, the first and second contact parts 56A and 56B are also formed of the same or similar metal or carbon nanotube material as that of the first and second cantilever electrodes 50A and 50B. The titanium and the titanium nitride are not easily oxidized even though exposed to air through the first and second lower voids 90A and 90B, and are not transformed even though it has a given level of curvature state, as conductive metal having an elastic force more than a plasticity/elasticity coefficient. The carbon nanotube is tube-shaped, and is formed by joining together six-sided shapes each constructed of 6 carbon atoms, such that the six-sided shapes are associated with one another. The diameter of the nanotube ranges from several nanometers to tens of nanometers; hence, the term "carbon nanotube." Additionally, in the carbon nanotube, an electrical conduction is similar to copper, and a heat conduction is the same as diamond most prominent therefor in the natural world, and the stiffness is prominent more by 100 times than steel. Carbon fiber is cut against the transformation of even 1%, but a carbon nanotube has a restoring force to endure against the transformation of 15%.

First and second upper word lines 40A and 40B are adapted to suspend at a given height through first and second upper voids 92A and 92B formed on the first and second cantilever electrodes 50A and 50B. The first and second upper word lines 40A and 40B are separated from each other by the trench 100, in second direction above the first and second lower word lines 30A and 30B. A third interlayer insulating film 28 is formed on the second interlayer insulating film 24 or the spacer formed in an outer part of the first and second upper word lines 40A and 40B, supporting and insulating the first and second upper word lines 40A and 40B. For example, the third interlayer insulating film 28 is formed including a silicon oxide, silicon nitride or silicon oxide nitride layer that electrically insulates the first and second cantilever electrodes 50A and 50B, and the first and second upper word lines 40A and 40B.

Although not shown in the drawings, the first and second lower voids 90A and 90B, and the first and second upper voids 92A and 92B may include a space formed by each removing a first dummy sacrifice layer (for example, 62 of FIG. 9A) and first sacrifice layer(for example, 60 of FIG. 9A) and second dummy sacrifice layer (for example, 72 of FIG. 14A) and second sacrifice layer(for example, 70 of FIG. 17A), exposed to the trench 100. The voids may be a space through which first and second contact parts 56A and 56B formed from each end part of the first and second cantilever electrodes 50A and 50B move in a third direction, i.e., Z-axis direction, perpendicular to the substrate 10.

Accordingly, the multibit electromechanical memory device comprises a unit cell 104 that is comprised of first and second memory units 102A and 102B separated from each other on the trench 100, or first and second memory units 102A and 102B separated from each other on the pad electrode 52. Here, the first and second memory units 102A and 102B adjacent mutually in first direction, i.e., X-axis direction, electrically share a single bit line 20. The first and second memory units 102A and 102B of each unit cell 104 mutually adjacent each other in the second direction, i.e., Y-axis direction, may electrically share first or second lower word line 30A or 30B, and may electrically share first or second upper word line 40A or 40B.

Also, the first and second cantilever electrodes 50A and 50B separated into both sides on the trench 100 or pad electrode 52 are formed as part of unit cell 104 that is classified as first and second memory units 102A and 102B each performing a switching operation, and thus can input/output data of two or more bits to/from each unit cell 104.

In an embodiment, the first and second lower word lines 30A and 30B to which an electrical signal to switch the first and second cantilever electrodes 50A and 50B is applied may be formed of conductive metal material having a low resistance as compared with a conventional polysilicon material, thus reducing a power consumption and increasing throughput.

Figure 4:
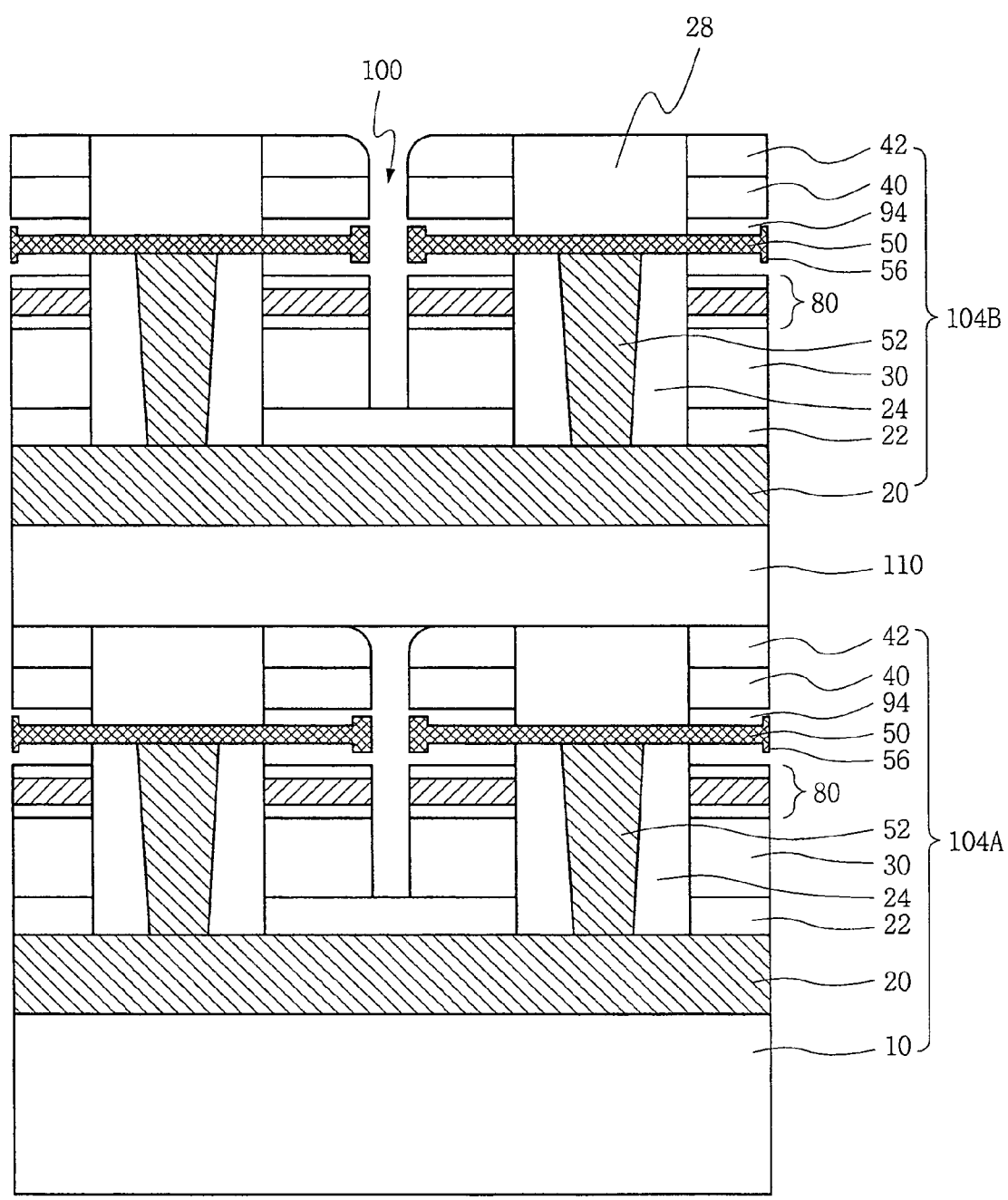
FIG. 4 is a sectional view of a stacked structure of multibit electromechanical memory devices shown in FIG. 3.

FIG. 4 is a sectional view of a stacked structure of multibit electromechanical memory devices shown in FIG. 3. A multibit electro-mechanical memory device according to an embodiment of the invention may be configured to have a stacked structure of the first and second unit cells 104A and 104B on a fourth interlayer insulating film 110 formed on the first unit cell 104A. The inside of the trench 100 of the first and second unit cells 104A and 104B may have a vacant vacuum state through which the cantilever electrode 50 can move upward and downward, or may be filled with non-reactive gas such as nitrogen gas or argon gas. The fourth interlayer insulating film 110 is formed to cover an upper part of the first unit cell 104A, to differentiate the first unit cell 104A from the second unit cell 104B. The fourth interlayer insulating film 110 is formed so as not to flow into the inside of void 94 through the trench 100. For example, the fourth interlayer insulating film 110 is formed containing polymer material formed on third interlayer insulating film 28 formed on the trench 100. Though not shown in the drawing, bit line 20 of the first unit cell 104A and bit line 20 of the second unit cell 104B may be formed to have mutually different directions, or the trench 100 of the first unit cell 104A may deviate from the trench 100 of the second unit cell 104B.

Thus, the multibit electromechanical memory device according to an embodiment of the invention may have the structure of stacking the second unit cell 104B on the fourth interlayer insulating film 110 formed on the first unit cell 104A that is formed on the substrate 10, thus increasing an integration of memory devices.

An operating method of multibit electromechanical memory device according to an embodiment of the invention is described as follows. The first and second lower word lines 30A and 30B, the first and second cantilever electrodes 50A and 50B, the first and second contact parts 56A and 56B and the first and second upper word lines 40A and 40B, may be each described herein as a lower word line 30, cantilever electrode 50, contact part 56 and upper word line 40, and also reference characters therefor may be changed in the description below. The first and second lower voids 90A and 90B may be described herein as a lower void 90, and the first and second upper voids 92A and 92B as an upper void 92. Further, the lower and upper voids 90 and 92 may be all described herein as a void 94, and reference characters therefor may be changed in the description below.

In the multibit electromechanical memory device according to an embodiment of the invention, given data can be programmed, deleted, programmed or read according to a position of the cantilever electrode 50. For example, when there does not exist an electrical field induced in the void 94, the cantilever electrode 50 may be supported horizontally at a height the same as or similar to the second interlayer insulating film 24 or spacer. On the other hand, when an electrical field of a given strength is induced in the void 94, a charge of a given strength is concentrated by the electrical field on the contact part 56 formed from an end part of the cantilever electrode 50, and the cantilever electrode 50 may be curved in a third direction vertical to the substrate 10. At this time, program, delete, program and readout operations can be performed by a switching operation since the contact part 56 can be attached to or detached from the lower word line 30 or upper word line 40.

Accordingly, program, delete, program and readout operations of each of first and second memory units 102A and 102B constituting the unit cell 104 can be individually performed by controlling a difference of voltage applied to each of the bit line 20, lower word line 30 and upper word line 40. For example, if a given voltage is independently applied to the first and second lower word lines 30A and 30B, and if a given voltage is independently applied to the first and second upper word lines 40A and 40B, then a state of the first and second memory units 102A and 102B may be equally programmed as "0" or "1" at the same time, or may be programmed different from each other as "0" and "1". Input/output data of the respective first and second memory units 102A and 102B may be combined. At this time, the first and second memory units 102A and 102B electrically share one bit line 20, thus program and read operations thereof cannot be simultaneously performed, and any one of the first and second memory units 102A and 102B must have an electrical use of the bit line 20 at a given time.

Thus, in the multibit electromechanical memory device according to an embodiment of the invention, data of 2 bits can be input/output to/from a unit cell that is constructed of the first and second memory units 102A and 102B that are programmed to have the same or different state symmetrically at both sides of the trench 100 or pad electrode 52.

As described above, when a charge having a polarity opposite to a charge applied to the lower word line 30 and trap site 80 is applied, the cantilever electrode 50 is curved to be in contact with the trap site 80 by an electrostatic force acting as an attractive force. Further, when a charge having the same polarity as a charge applied to the lower word line 30 and trap site 80 is applied, the cantilever electrode 50 can be separated from the trap site 80 by an electrostatic force acting as a repulsive force. When the cantilever electrode 50 is curved so that a contact part 56 is in contact with the trap site 80, it should overcome an elasticity or restoring force of a given strength. The elastic force or restoring force generally depends upon Hook's law proportionate to a movement distance, and the electrostatic force is based on Coulomb's law proportionate to the square of movement distance. The curved direction and the movement direction of the cantilever electrode 50 and the contact part 56 may be each decided by an electrostatic force generated depending upon a polarity of charge and charge amount applied to the lower word line 30 and trap site 80.

FIGS. 5A to 6B are sectional views providing operations of programming to or reading data out of a multibit electromechanical memory device according to an embodiment of the invention.

Figure 5A:
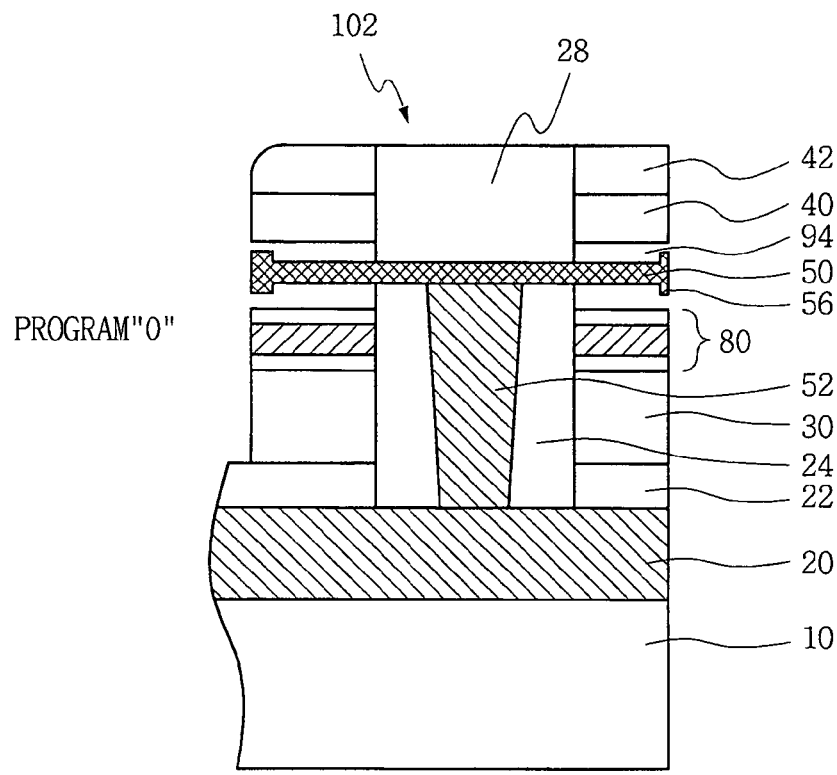
FIG. 5A to 6B are sectional views providing operations of programming to or reading data out of a multibit electromechanical memory device according to an embodiment of the invention.
Figure 5B:
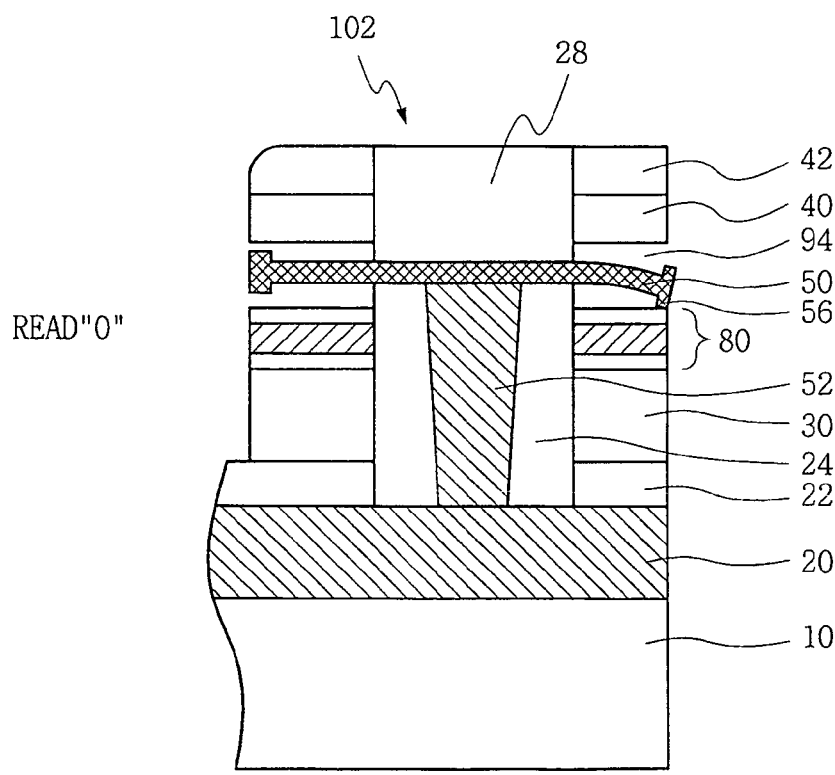

As shown in FIGS. 5A and 5B, to program data corresponding to '0' in a multibit electromechanical memory device according to an embodiment of the invention, a first voltage, i.e., Vpull-in, is applied between the lower word line 30 and the bit line 20, and so the cantilever electrode 50 is curved downward so that the contact part 56 contacts the trap site 80. At this time, programming data corresponding to '0' may be called "PROGRAM '0'." That is, first voltage having a given strength is applied between the bit line 20 and the lower word line 30 and so the cantilever electrode 50 is curved so that the contact part 56 becomes contacted with the trap site 80, thereby programming data corresponding to '0'. Further, a second voltage induced between the bit line 20 and the lower word line 30, and a third voltage induced between the bit line 20 and the upper word line 40 are compared to each other. When the second voltage is greater, data corresponding to '0' can be read out. This is why a distance between the cantilever electrode 50 electrically connected to the bit line 20 and the lower word line 30 is shorter than a distance between the cantilever electrode 50 and the upper word line 40 and so the voltage is proportionate to an inverse number of the distance.

Consequently, in a multibit electromechanical memory device according to an embodiment of the invention, a first voltage having a given strength is applied to the cantilever electrode 50 electrically connected to the bit line 20 and the lower word line 30 and so the cantilever electrode 50 is curved so that the contact part 56 is in contact with the trap site 80, thus programming data corresponding to '0'. Additionally, the second voltage induced between the bit line 20 and the lower word line 30, and the third voltage induced between the bit line 20 and the upper word line 40 are compared, and when the second voltage is greater, data corresponding to '0' can be read out. The contact part 56 may become a contact point electrically contacted with either the trap site 80 or the upper word line 40. Even though the magnitudes of the second and third voltages are reduced according to a thickness increase of the contact part 56, the cantilever electrode 50 can be easily curved and a switching distance of the cantilever electrode 50 can be reduced.

Figure 6A:
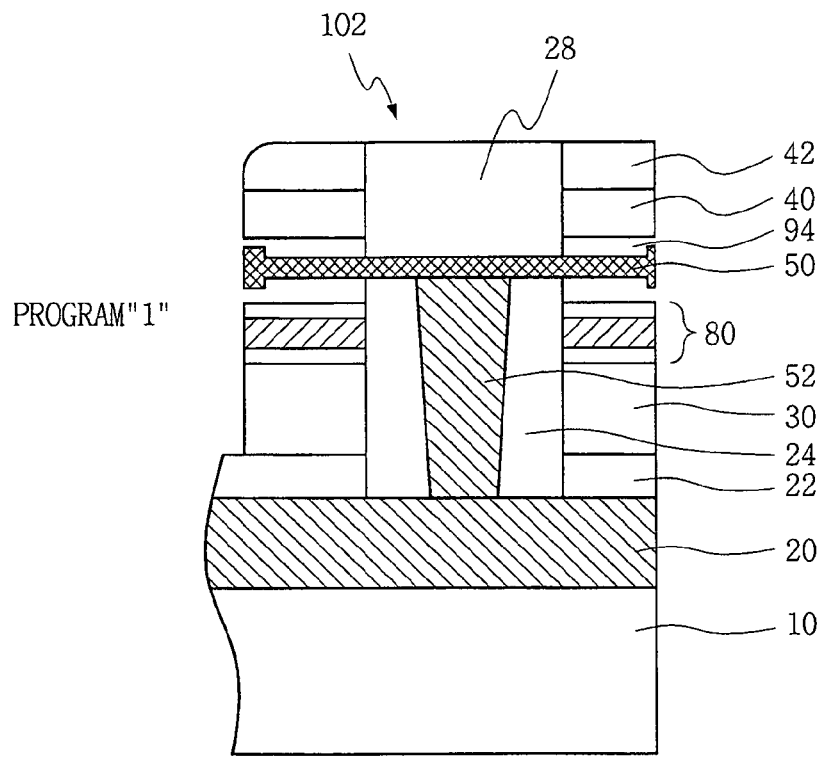
Figure 6B:
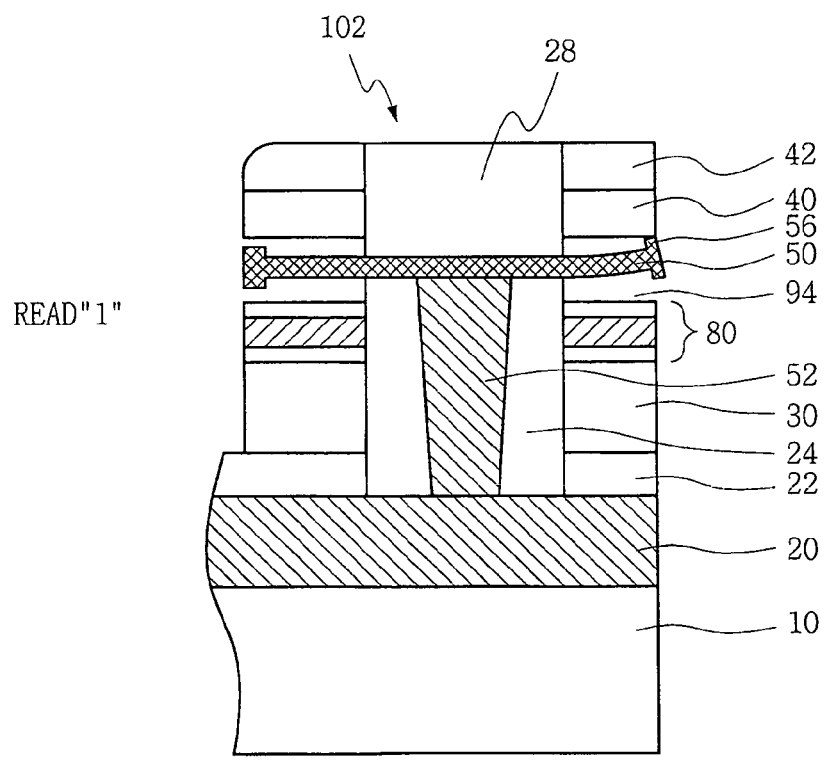

As shown in FIGS. 6A and 6B, to program data corresponding to '1' in a multibit electro-mechanical memory device according to an embodiment of the invention, a fourth voltage, i.e., Vpull-out, of a given strength is applied between the lower word line 30 and the bit line 20, and so the contact part 56 is separated from the trap site 80. Thus, the cantilever electrode 50 is in a horizontal state. When the contact part 56 is already separated from the trap site 80, it does not matter that the fourth voltage is not applied. Programming data corresponding to '1' may be called "PROGRAM '1'." Further, a second voltage induced between the bit line 20 and the lower word line 30, and a third voltage induced to between the bit line 20 and the upper word line 40 are compared, and when the third voltage is greater than the second voltage, data corresponding to '1' can be read out. In reading data corresponding to '1', the cantilever electrode 50 is positioned near the upper word line 40 as compared with the lower word line 30, the cantilever electrode 50 can be curved being electrically contacted with the upper word line 40 by an electrostatic force acting as an attractive force between the cantilever electrode 50 and the upper word line 40.

Therefore, in the multibit electromechanical memory device according to an embodiment of the invention, data of '0' or '1' can be programmed according to either a contact state or separated state between the contact part 56 formed from an end part 56 of the cantilever electrode 50 and the trap site 80, and data of '0' or '1' can be read out corresponding to a curved direction of the cantilever electrode 50.

Figure 7:
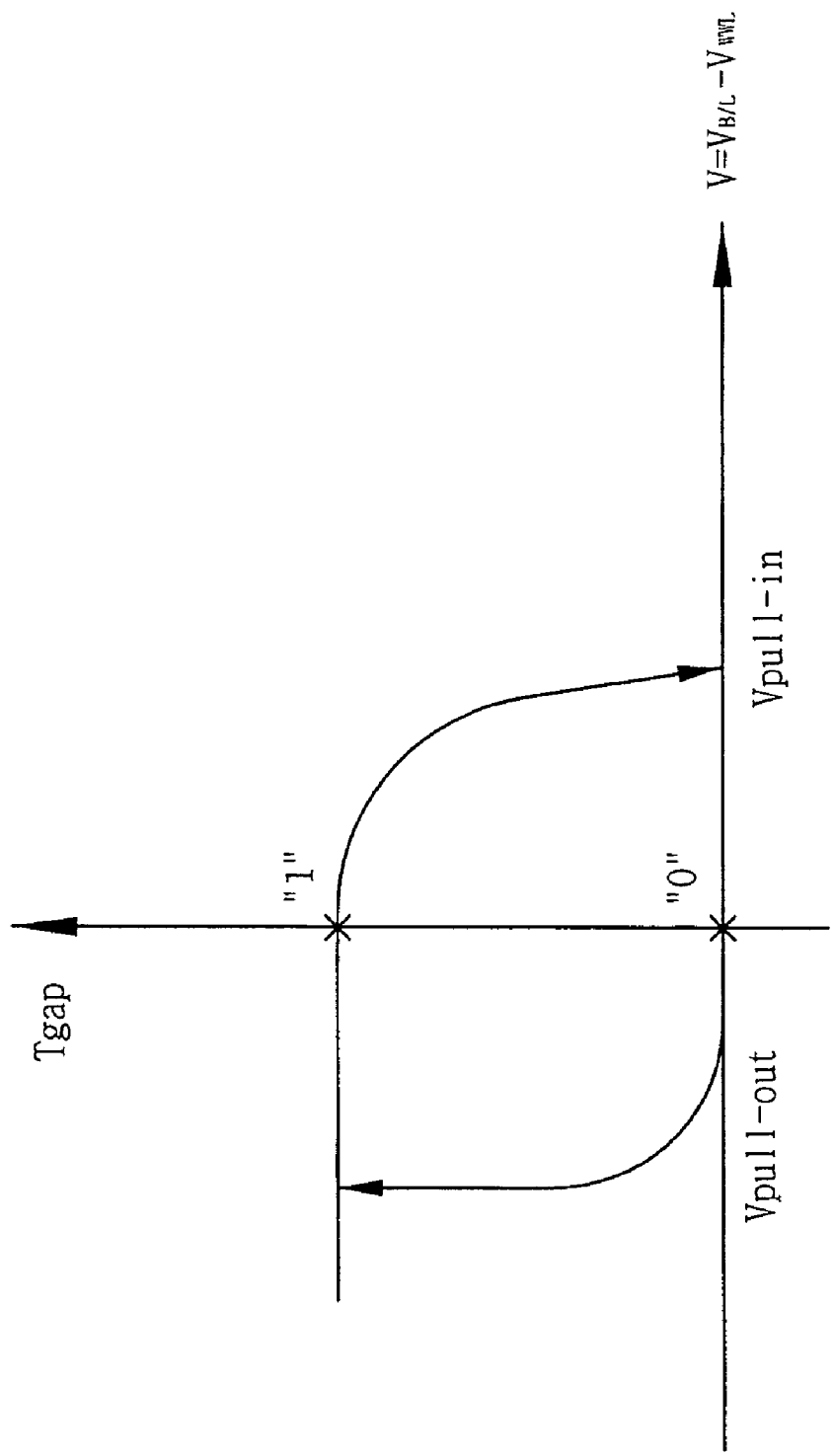
FIG. 7 is a graph illustrating a correlation between a voltage applied through a bit line and lower word line and a curved distance of cantilever electrode in a multibit electromechanical memory device according to an embodiment of the invention.

FIG. 7 is a graph illustrating a correlation between a voltage applied through the bit line 20 and the lower word line 30 and a movement distance of the contact part 56 formed from an end part of the cantilever electrode 50 in a multibit electro-mechanical memory device according to an embodiment of the invention. When a voltage of "Vpull-in" having a positive value is applied between the bit line 20 and the lower word line 30, the cantilever electrode 50 is curved down so that the contact part 56 is in contact with the trap site 80, thus programming data corresponding to '0'. When a voltage of "Vpull-out" having a negative value is applied between the bit line 20 and the lower word line 30, the contact part 56 is separated from the trap site 80 and thus data corresponding to '1' can be programmed. A transverse axis indicates the magnitude of voltage, and a longitudinal axis indicates a movement distance Tgap that the cantilever electrode 50 moves from the surface of the trap site 80 to the upper word line 40. When a voltage of "Vpull-in" having a positive value or a voltage of "Vpull-out" having a negative value is applied to the cantilever electrode 50 connected to the bit line 20 and the lower word line 30, the contact part 56 formed from an end part of the cantilever electrode 50 is contacted with or separated from the trap site 80. Thus programming digital data corresponding to 1 bit has a value of '0' or '1'.

At this time, the voltage of "Vpull-in" and "Vpull-out" may be decided by the following formula.

$$V = V_{B/L} - V_{WWL}$$ (Mathematical Formula)

The "V" indicates voltage of "Vpull-in" or "Vpull-out", and "$V_{B/L}$" designates a voltage applied to the bit line 20, and "$V_{WWL}$" indicates a voltage applied to the lower word line 30. At this time, the voltage of "Vpull-in" has a positive value, and the voltage of "Vpull-out" has a negative value. For example, when absolute values of the voltage of "Vpull-in" and the voltage of "Vpull-out" are the same or similar to each other, a voltage of ½*"Vpull-in" is applied to the bit line 20 and a voltage of ½*"Vpull-out" is applied to the lower word line 30 in programming data corresponding to a value of '0', thereby electrically contacting the contact part 56 to the lower word line 30 through an downward curved operation of the cantilever electrode 50.

Furthermore, in programming data corresponding to '1', a voltage of ½*"Vpull-out" is applied to the bit line 20 and a voltage of ½*"Vpull-in" is applied to the lower word line 30, thereby separating the contact part 56 from the lower word line 30. Although not shown in the drawings, bit line 20, lower word line 30 and upper word line 40, to which the voltage of "Vpull-in" or "Vpull-out" is not applied, may have a grounded state.

A method of manufacturing a multibit electromechanical memory device described above according to an embodiment of the invention is described as follows.

FIGS. 8A to 21B are sectional views of processes to manufacture a multibit electro-mechanical memory device according to an embodiment of the invention. FIGS. 8A to 21A are sectional views of sequential processes taken along a line I-I' of FIG. 2 and FIGS. 8B to 21B are sectional views of sequential processes taken along a line II-II' of FIG. 2.

Figure 8A:
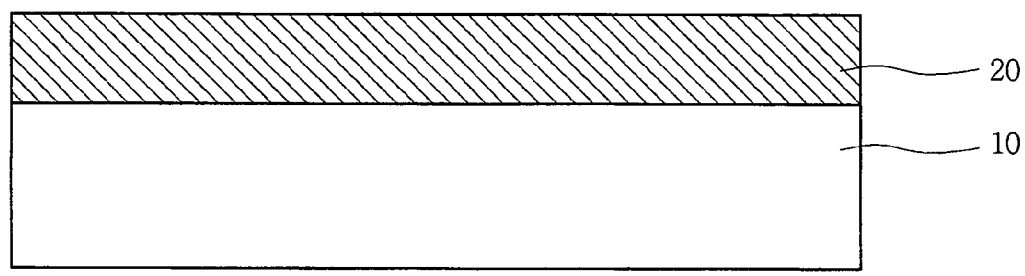
FIGS. 8A to 21B are sectional views of processes to manufacture a multibit electromechanical memory device according to an embodiment of the invention.
Figure 8B:
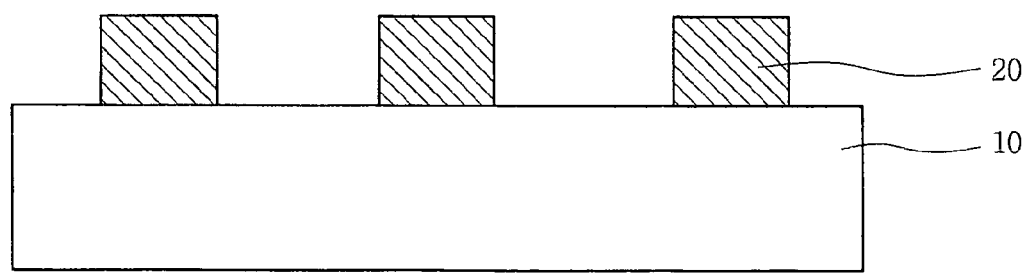

As shown in FIGS. 8A and 8B, a bit line 20 with a given thickness is formed in a first direction on a substrate 10 of a horizontal state. That is, a plurality of bit lines 20 are formed in parallel in the first direction on the substrate 10. In an embodiment, the bit line 20 contains a conductive metal film such as gold, silver, copper, aluminum, tungsten, tungsten silicide, titanium, titanium nitride, tantalum, tantalum silicide formed by a physical vapor deposition(PVD) or chemical vapor deposition(CVD), or other conductive metal film known to those of skill in the art, or contains a polysilicon film or crystal silicon film doped with conductive impurity. Although not shown in the drawings, the bit line 20 may be formed by aeolotropically etching the conductive metal film formed with a given thickness on an entire face of the substrate 10 or the polysilicon layer through a dry etching method that uses a photoresist pattern or first hard mask layer as an etch mask layer, the photoresist pattern or first hard mask layer being for shielding thereon to produce a given line width. For example, a reactive gas used for the dry etching method of the conductive metal layer or polysilicon layer may contain a strong acid gas mixed with sulphuric acid and nitric acid. In an embodiment, the bit line 20 has a thickness of about 200 Å and a line width of about 50 Å.

Figure 9A:
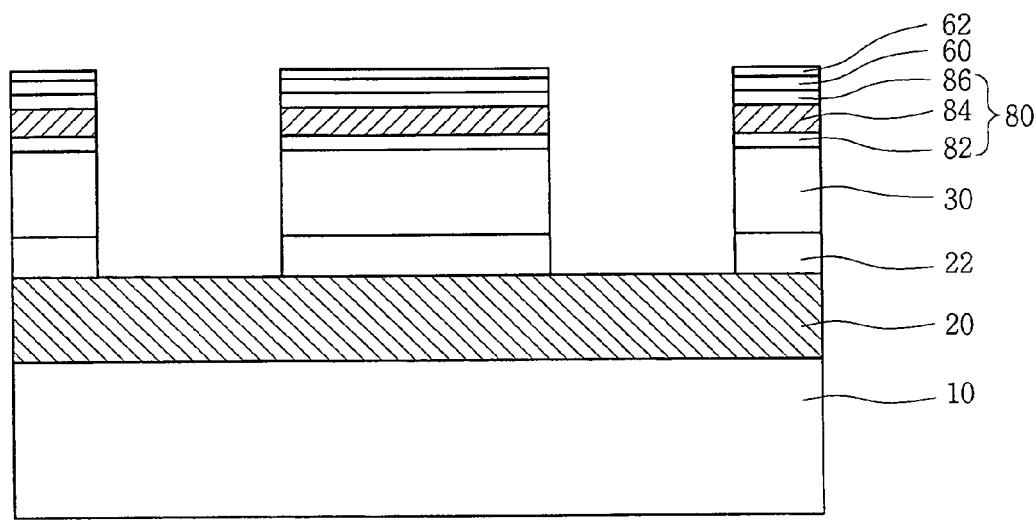
Figure 9B:
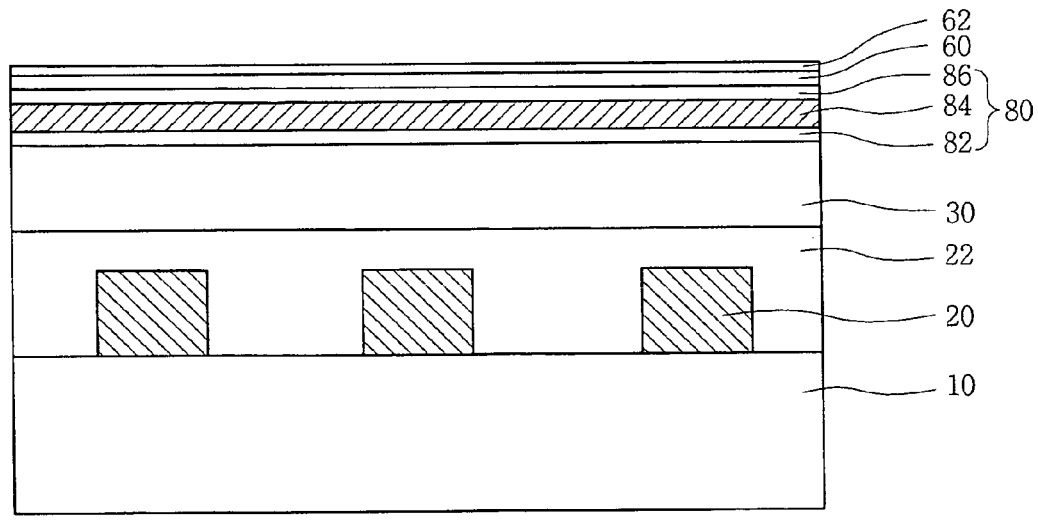

As shown in FIGS. 9A and 9B, a first interlayer insulating film 22, lower word line 30, trap site 80, first sacrifice layer 60 and first dummy sacrifice layer 62 are formed with a given line width in second direction intersecting the bit line 20. The first interlayer insulating film 22, lower word line 30, first sacrifice layer 60 and first dummy sacrifice layer 62 are stacked with a given thickness and are aeolotropically etched through the dry etching method that uses photoresist pattern or a second hard mask layer formed on the first dummy sacrifice layer 62 as an etching mask layer. The second hard mask layer or photoresist pattern is removed. In an embodiment, the first interlayer insulating film 22 contains silicon oxide or silicon nitride, and is formed having a thickness of about 150 Å through about 200 Å. The first interlayer insulating film 22 may function as an etch stop layer in a subsequent process of forming trench 100 to separate the lower word line into the first and second lower word lines 30 in a length direction. In an embodiment, the lower word line 30 comprises conductive metal layer having a prominent conduction, such as gold, silver, copper, aluminum, tungsten, tungsten silicide, titanium, titanium nitride, tantalum, tantalum silicide or other conductive metals known to those of skill in the art, and is formed with a thickness of about 200 Å through PVD or CVD. In an embodiment, the trap site 80 includes a first silicon oxide layer 82, silicon nitride layer 84 and second silicon oxide layer 86 with each thickness of 100 Å, 200 Å and 100 Å. In an embodiment, the first sacrifice layer 60 includes a polysilicon layer formed with a thickness of about 10 Å to about 30 Å through an atom layer deposition or CVD. The first dummy sacrifice layer 62 is also formed including a silicon germanium layer formed with a thickness of about 10 Å to about 30 Å through an atom layer deposition or CVD. The first dummy sacrifice layer 62, first sacrifice layer 60, lower word line 30 and first interlayer insulating film 22 are formed with a line width of about 50A. Further, reactive gas used for the dry etching method to pattern the first dummy sacrifice layer 62, first sacrifice layer 60, lower word line 30 and first interlayer insulating film 22 may be a gas of FC-group such as $C_xF_y$ group or $C_aH_bF_c$ group etc. The gas of FC-group may be formed of gas such as $CF_4$, $CHF_3$, $C_2F_6$, $C_4F_8$, $CH_2F_2$, $CH_3F$, $CH_4$, $C_2H_2$, $C_4F_6$, etc. or their mixture.

Figure 10A:
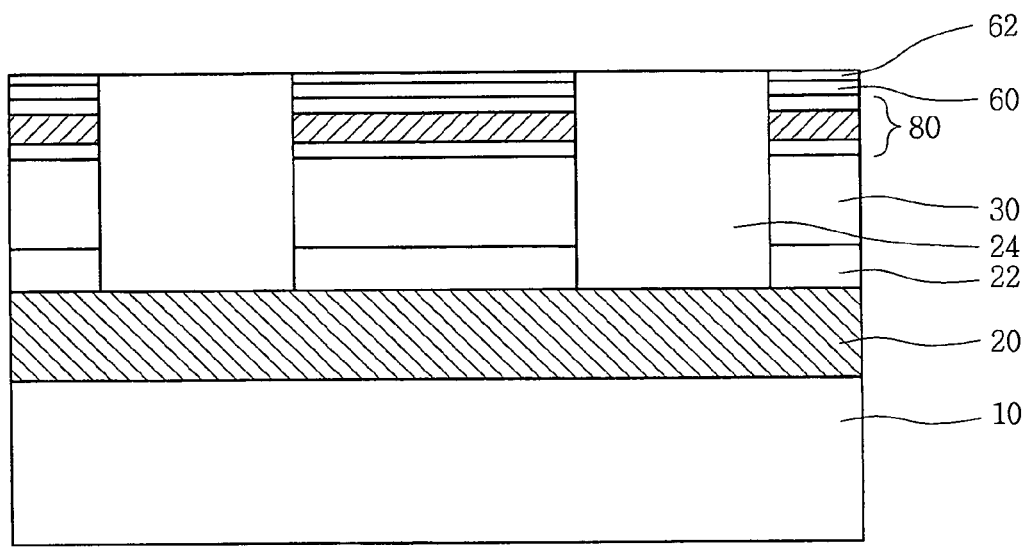
Figure 10B:
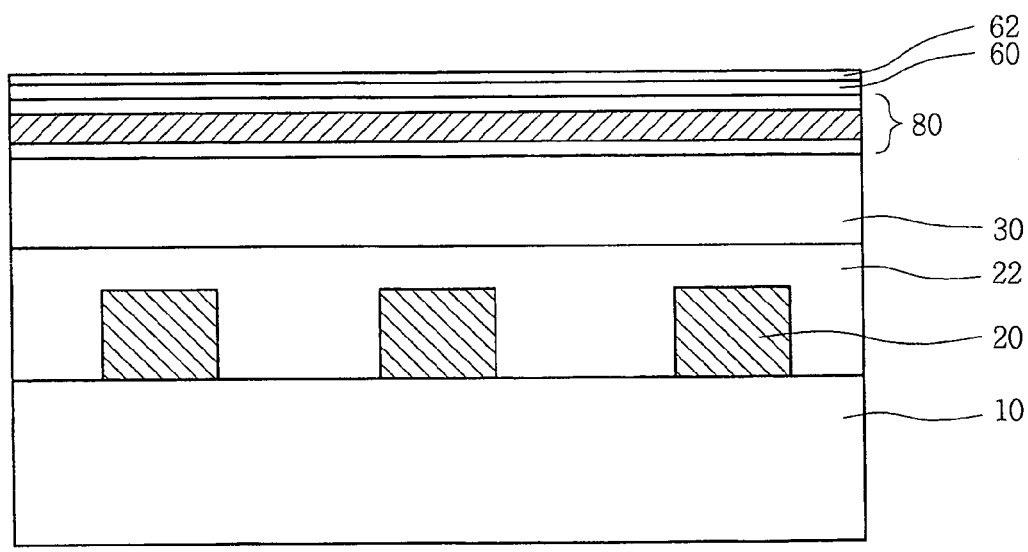

As shown in FIGS. 10A and 10B, a second interlayer insulating film 24 is formed, filling in the sidewall of the stack comprising the first interlayer insulating film 22, lower word line 30, trap site 80, first sacrifice layer 60 and first dummy sacrifice layer 62. The second interlayer insulating film 24 electrically isolates unit cells from each other, for example, another unit cell adjacent to unit cell 104 (see FIG. 2A) including the first interlayer insulating film 22, the trap site 80, the first sacrifice layer 60 and the first dummy sacrifice layer 62. For example, the second interlayer insulating film 24 may be formed by forming a silicon oxide layer on an entire face of substrate 10 on which the stack has been formed, to cover the stack, through the CVD, and then removing the silicon oxide layer to be planarized, whereby the first dummy sacrifice layer 62 is exposed.

Although not shown in the drawing, before forming the second interlayer insulating film 24, a spacer may be formed in a sidewall of the stack that is comprised of the first interlayer insulating film 22, lower word line 30, trap site 80, first sacrifice layer 60 and first dummy sacrifice layer 62. The spacer may assist in completing a process for the sidewall of the stack and easily forming the contact hole 54 from which pad electrode 52 is formed in a subsequent process. For example, the spacer may be formed by forming a silicon nitride layer of given thickness on an entire face of the substrate 10 on which the stack has been formed and by removing the silicon nitride layer through the dry etching method having a prominent aeolotropy vertical etching characteristic, so as to be selectively formed in the sidewall of the stack, the stack including the first interlay insulation layer 22, lower word line 30, trap site 80, first sacrifice layer 60 and first dummy sacrifice layer 62. Then, second interlayer insulating film 24 may be formed on an entire face of the substrate 10 on which the spacer has been formed. Similarly, the second interlayer insulating film 24 may be formed by forming silicon oxide layer covering the stack on the entire face of the substrate 10 on which the stack has been formed, through CVD, and then removing the silicon oxide layer to be planarized so as to expose the first sacrifice layer 60.

Figure 11A:
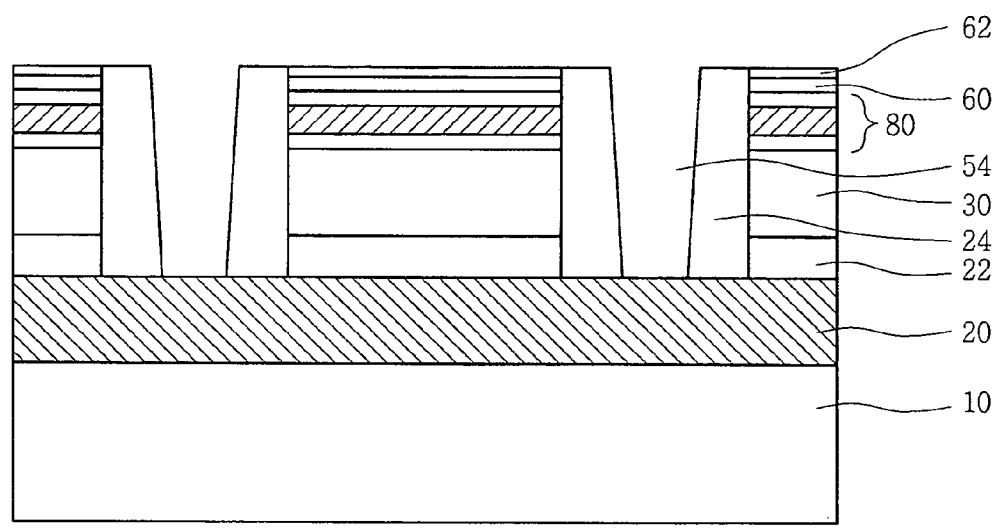
Figure 11B:
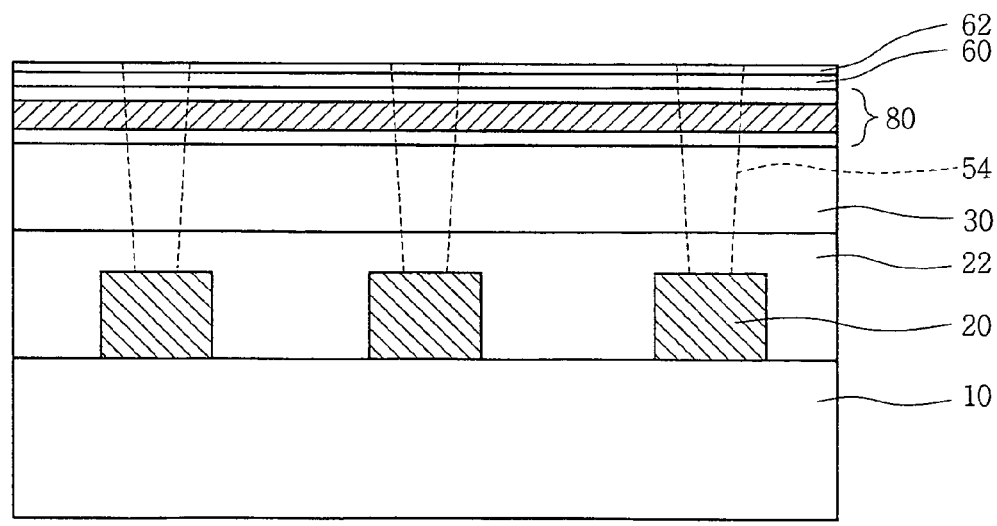

With reference to FIGS. 11A and 11B, contact hole 54 is formed by selectively removing portions of the second interlayer insulating film 24 formed on the bit line 20. The contact hole 54 must be formed so as not to expose the sidewall of the first interlayer insulating film 22, lower word line 30, trap site 80, first sacrifice layer 60 and first dummy sacrifice layer 62 between mutually adjacent first and second memory units 102. In this manner, a pad electrode 52 formed inside the contact hole 54 in a subsequent process receives a charge applied through the bit line 20 independently from a charge applied to the trap site 80 and the lower word line 30. In an embodiment, the contact hole 54 has a radius of about 20 Å through 80 Å.

Figure 12A:
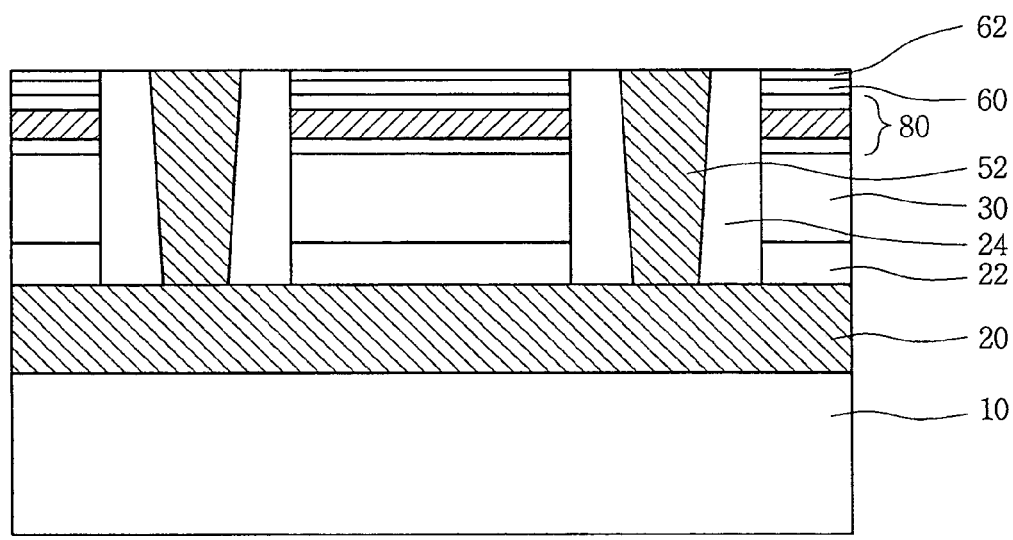
Figure 12B:
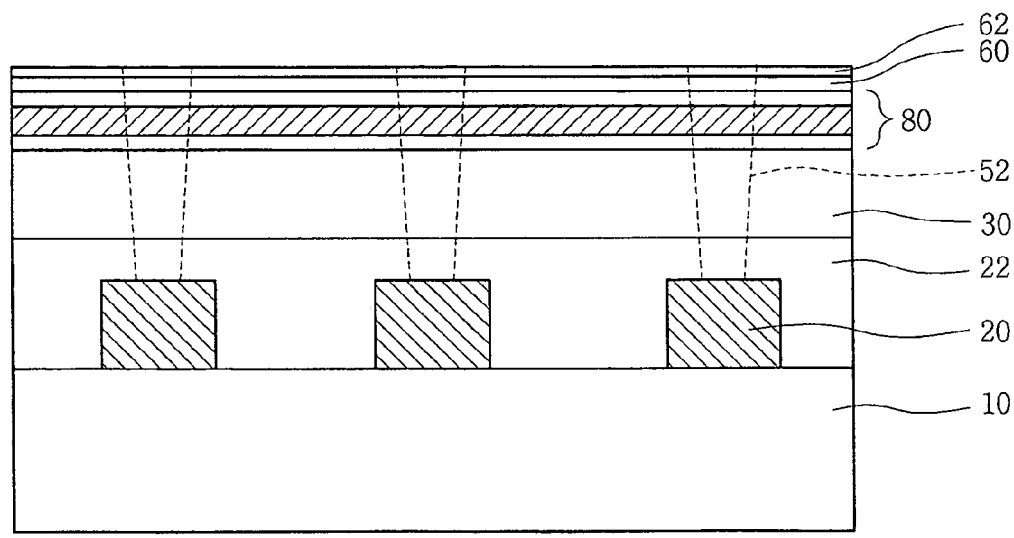

As shown in FIGS. 12A and 12B, a pad electrode 52 is buried in the contact hole 54. The pad electrode 52 is electrically connected to a portion of the bit line 20 exposed to the contact hole 54. Although not shown in the drawing, at least one conductive layer may be further formed to produce an ohmic contact between the bit line 20 and the pad electrode 52. For example, the pad electrode 52 may be produced by forming polysilicon doped with conductive impurity or conductive metal filling in the contact hole 54 of a given thickness through the PVD or CVD, and by removing the doped polysilicon or conductive metal to be planarized so as to expose the second interlayer insulating film 24 and the first dummy sacrifice layer 62. Thus, the pad electrode 52 is formed to have the same or similar height as the second interlayer insulating film 24 and the first dummy sacrifice layer 62. Further, an oxide removing process or etching process may be further executed to remove an oxide layer formed on the surface of the bit line 20 exposed to the contact hole 54, before forming the pad electrode 52.

Figure 13A:
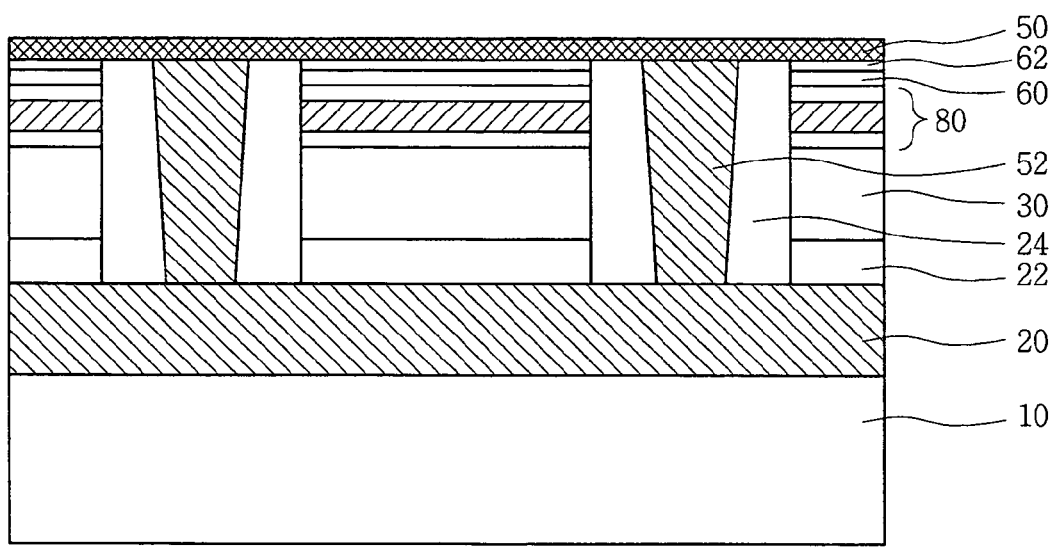
Figure 13B:
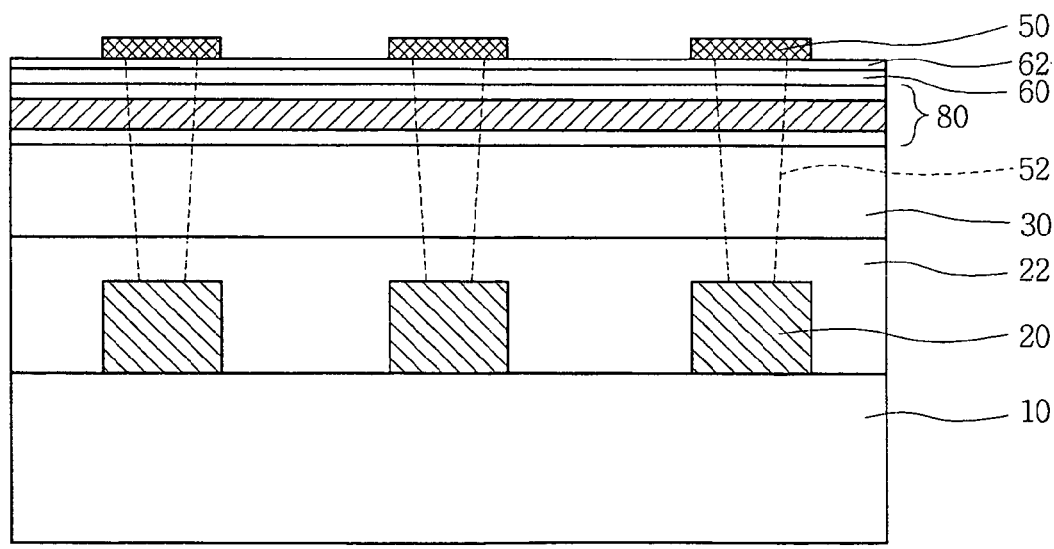

As shown in FIGS. 13A and 13B, a cantilever electrode 50 with a given line width is formed crossing in the first direction on a stack, the stack including the first dummy sacrifice layer 62, first sacrifice layer 60, trap site 80, lower word line 30 and first interlayer insulating film 22, the cantilever electrode 50 in contact with the upper part of the pad electrode 52. The cantilever electrode 50 has the same or similar line width as the bit line 20 and is formed in the first direction parallel to the bit line 20 on the stack and the pad electrode 52, thus may be referred to hereinafter as an upper bit line. At this time, the upper bit line may be formed as the cantilever electrode 50, which has a node that is divided by a trench 100 formed in a subsequent process. For example, the cantilever electrode 50 may be formed containing titanium, titanium nitride, or carbon nanotube formed with a thickness of about 30 Å through about 50 Å through the PVD, CVD or electrical discharge. At this time, the cantilever electrode 50 may be patterned and formed through the dry etching method that employs a photoresist pattern or second hard mask layer(not shown) as an etching mask, the photoresist pattern or second hard mask layer shielding the titanium, nitride titanium or carbon nanotube formed on the bit line 20. The photoresist pattern or second hard mask layer is removed in the patterning of the cantilever electrode 50.

Accordingly, in a method of manufacturing a multibit electromechanical memory device according to an embodiment of the invention, the cantilever electrode 50 can be formed in the first direction on the pad electrode 52 that is electrically connected to the bit line 20 formed in the first direction on the substrate 10.

Figure 14A:
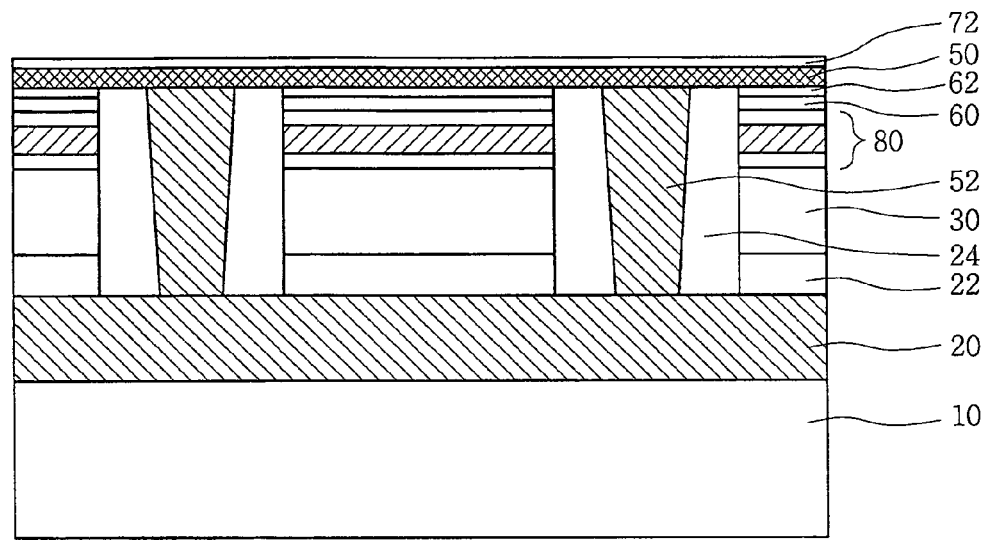
Figure 14B:
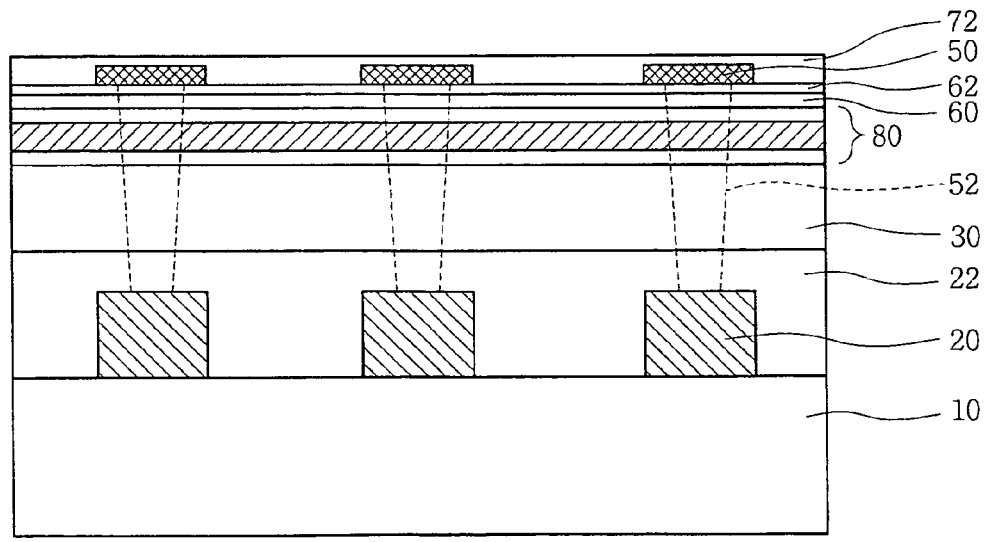

As shown in FIGS. 14A and 14B, a second dummy sacrifice layer 72 with a given thickness is formed on an entire face of the substrate 10 on which the cantilever electrode 50 has been formed. The second dummy sacrifice layer 72 is formed containing silicon germanium layer formed with a thickness of about 10 Å through about 30 Å through an atomic layer deposition or CVD.

Figure 15A:
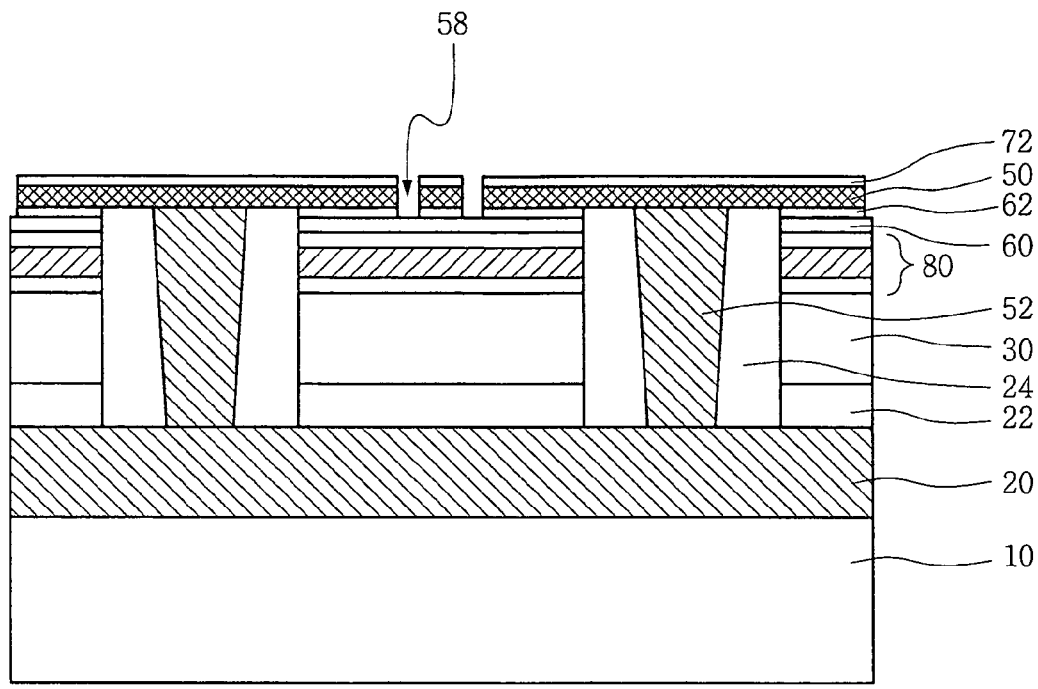
Figure 15B:
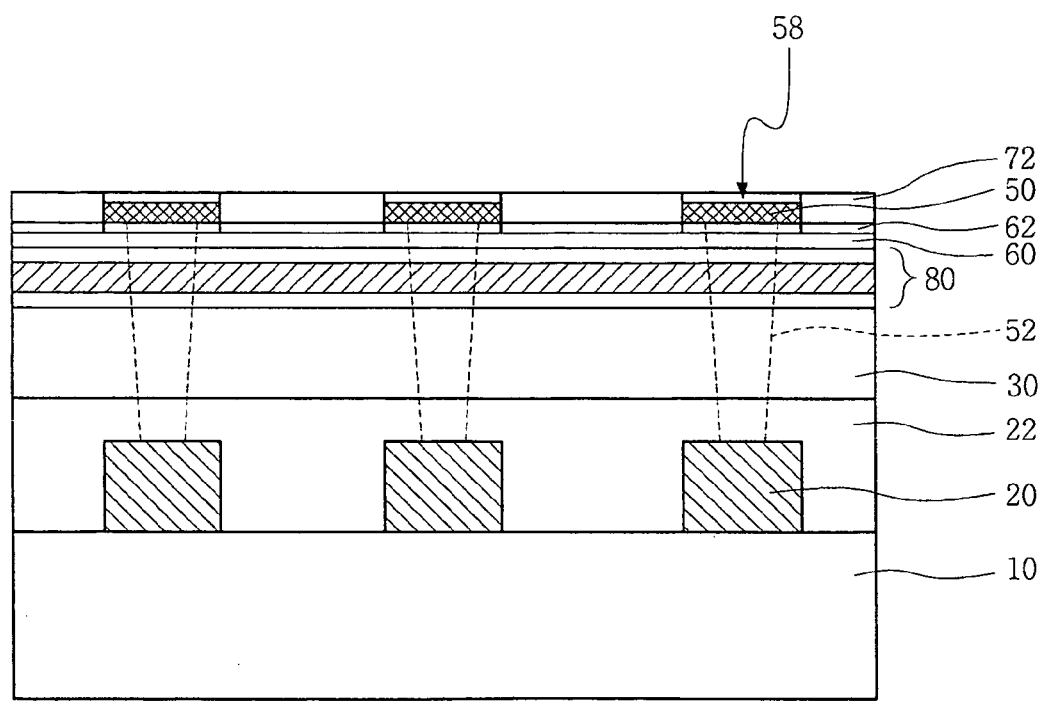

As illustrated in FIGS. 15A and 15B, the second dummy sacrifice layer 72, cantilever electrode 50 and first dummy sacrifice layer 62 provided between the pad electrode 52 are partially removed, thus forming a dimple 58 to selectively expose the first sacrifice layer 60. The dimple 58 may be formed as a dented shape to which the first sacrifice layer 60 is exposed from the bottom thereof, by removing portions of the second dummy sacrifice layer 72, cantilever electrode 50, and first dummy sacrifice layer 62 through the dry etching method that uses a third hard mask layer (not shown) or photoresist pattern as a mask layer to expose a portion of the second dummy sacrifice layer 72 between the pad electrodes 52.

Figure 16A:
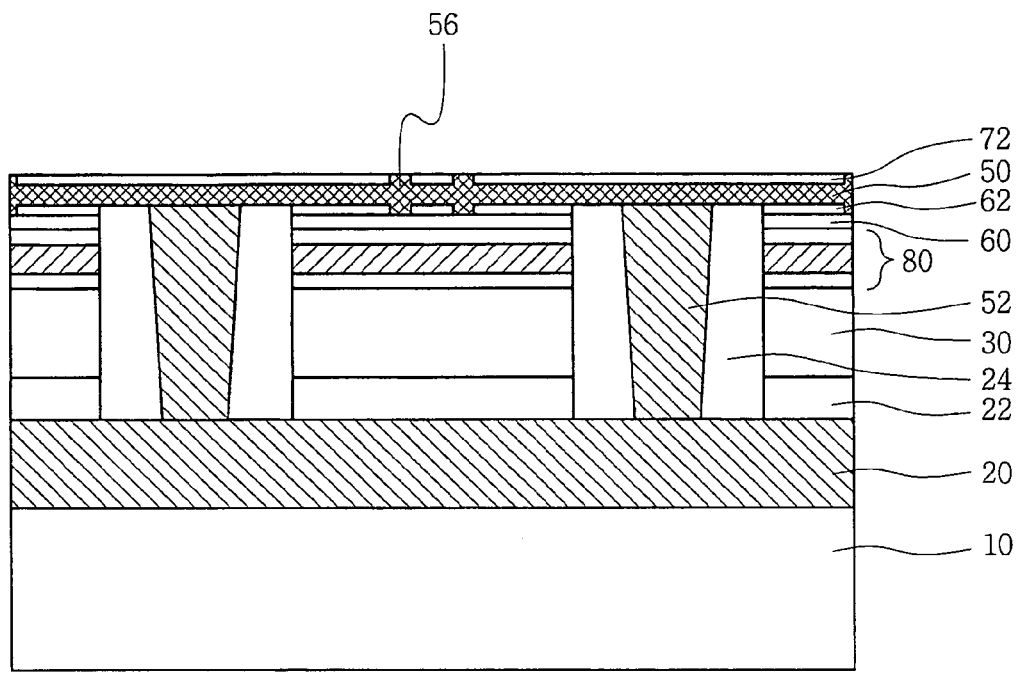
Figure 16B:
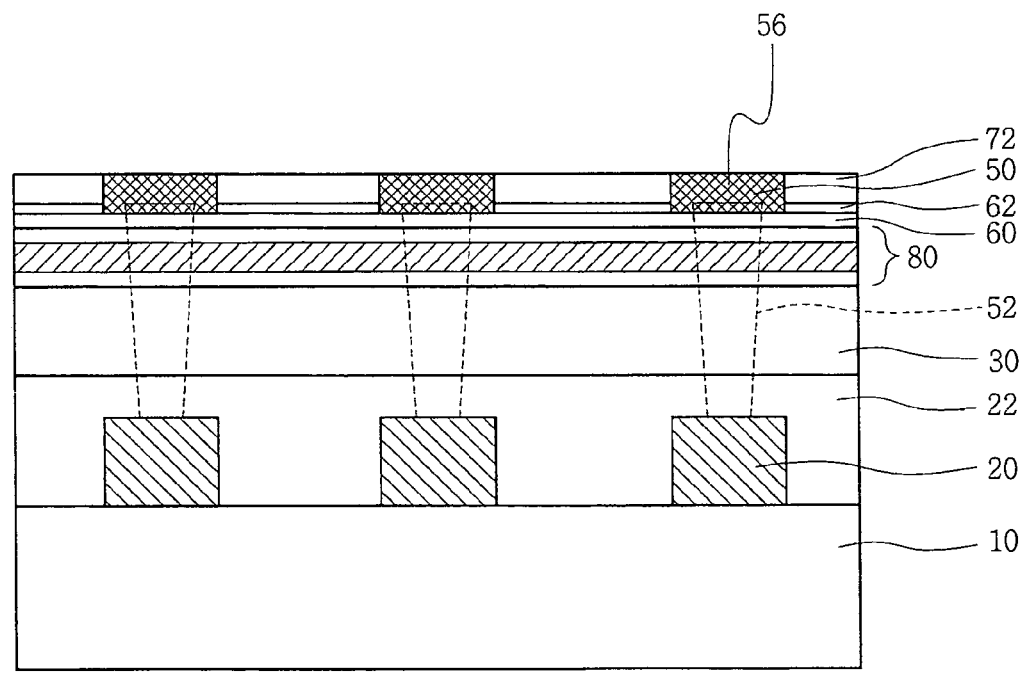

As shown in FIGS. 16A and 16B, a same or similar metal layer or carbon nanotube as that of the cantilever electrode 50 is filled in the dimple 58, and the metal layer or the carbon nanotube is removed from the top surface of the exposed portion of the second dummy sacrifice layer 72 by being planarized so as to expose the second dummy sacrifice layer 72. Thus, a contact part 56 is formed inside the dimple 58. The contact part 56 may be formed in a third direction, protruding by a level lower than the cantilever electrode 50 by filling in the inside of the dimple 58. The contact part 56 is electrically contacted with the trap site 80 at an end part of the cantilever electrode 50 that a node is divided by a trench to be formed in a subsequent process, and the contact part 56 may be formed to reduce a curved distance of the cantilever electrode 50.

Therefore, in a method of manufacturing a multibit electromechanical memory device according to an embodiment of the invention, the contact part 56 protrudes having a predefined thickness in the third direction from an end part of the cantilever electrode 50. In a subsequent process (see FIG. 19A), a trench 100 divides the node between pad electrodes 52. Thus, a curved distance of the cantilever electrode 50 can be lessened and a power consumption can be reduced.

Figure 17A:
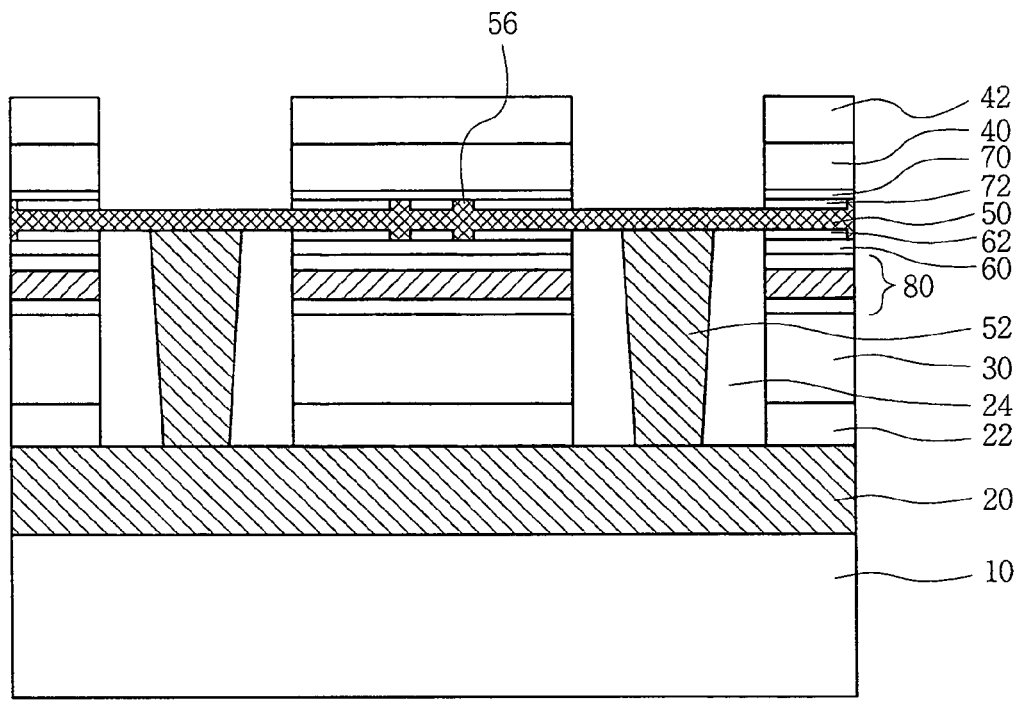
Figure 17B:
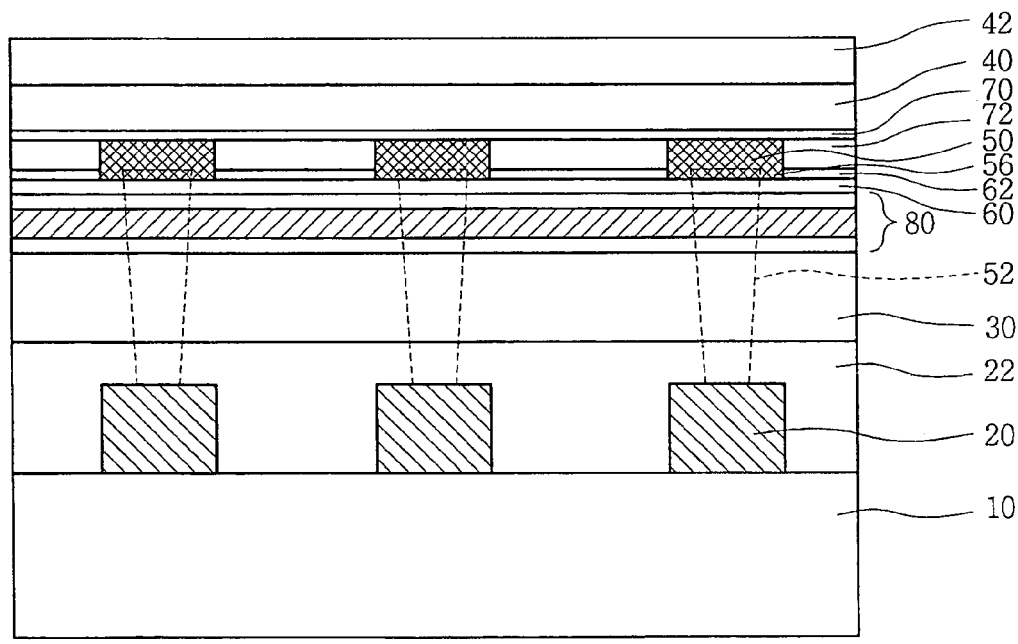

As illustrated in FIGS. 17A and 17B, on the second dummy sacrifice layer 72, cantilever electrode 50 and contact part 56, the second sacrifice layer 70 and upper word line 40 are formed in the second direction parallel to the first sacrifice layer 60, trap site 80 and lower word line 30. The second sacrifice layer 70 and upper word line 40 are formed symmetrically to the first sacrifice layer 60, trap site 80 and lower word line 30, interposing the second sacrifice layer 72, cantilever electrode 50 and first dummy sacrifice layer 62 therebetween. For example, the second sacrifice layer 70 is formed of polysilicon material formed by an atomic layer deposition or CVD like the first sacrifice layer 60, and has the thickness of about 50 Å to about 150 Å. The upper word line 40 is formed having a thickness of about 200 Å. The second sacrifice layer 70 and the upper word line 40 are formed having a line width of each about 50 Å. At this time, the second sacrifice layer 70 and upper word line 40 may be formed as follows. First, a polysilicon layer, conductive metal layer and fourth hard mask layer 42 with a given thickness through the CVD are formed on the second interlayer insulating film 24, second dummy sacrifice layer 72 and contact part 56. Then, photoresist pattern is formed to shield the fourth hard mask layer 42 on the first dummy sacrifice layer 62, first sacrifice layer 60, trap site 80 and lower word line 30, and the fourth hard mask layer 42 is removed through the dry or wet etching method that uses the photoresist pattern as an etching mask, and then the photoresist pattern is removed through an ashing process. Finally, the polysilicon layer and conductive metal layer are etched sequentially, aeolotropically through the dry or wet etching method that uses the fourth hard mask layer 42 as an etching mask, thus forming the second sacrifice layer 70 and the upper word line 40. At this time, portions of the second dummy sacrifice layer 72 are removed such that the layer 72 has the same line width as the patterned second sacrifice layer 70 and the upper word line 40, thus exposing at a least a portion of the cantilever electrode 50 formed on the pad electrode 52.

Figure 18A:
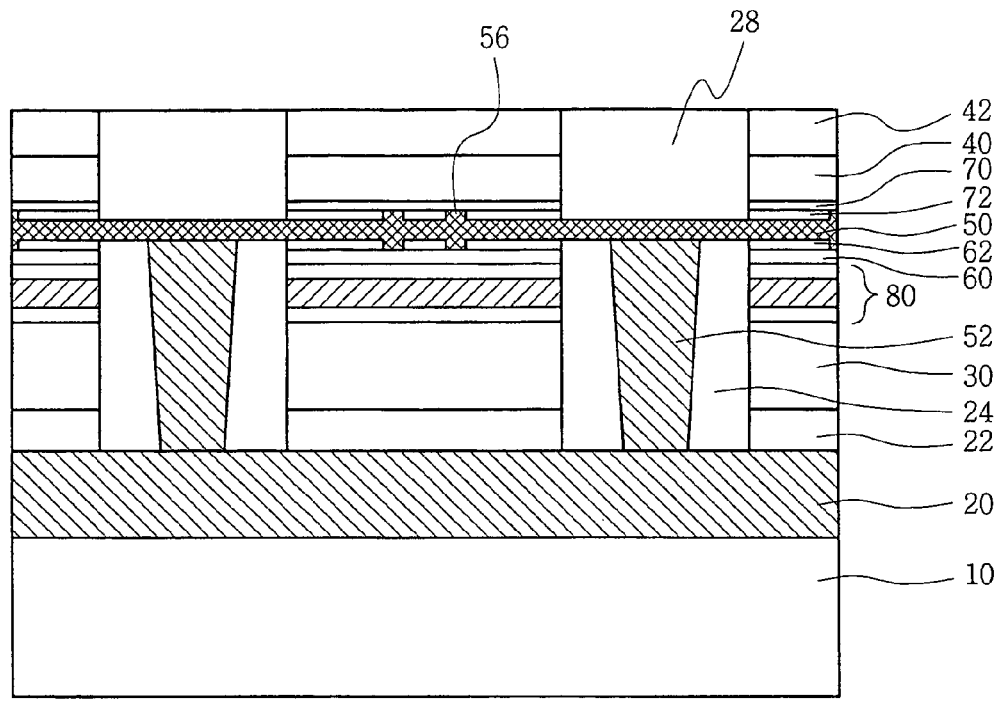
Figure 18B:
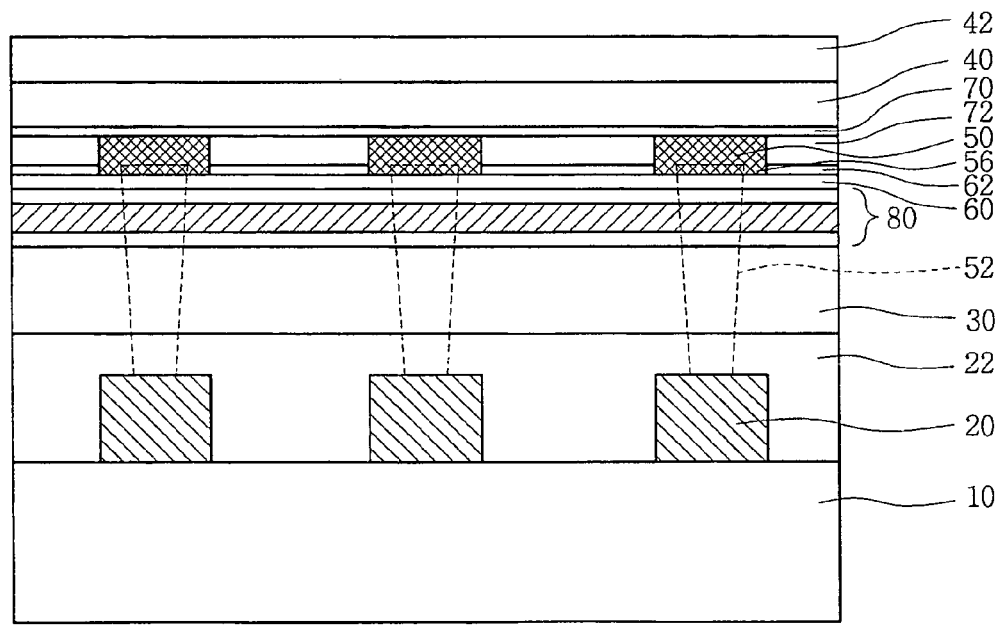

As shown in FIGS. 18A and 18B, a third interlayer insulating film 28 of a given thickness is formed on the cantilever electrode 50 contacting the pad electrode 52, the fourth hard mask layer 42 and the second interlayer insulating film 24, and the third interlayer insulating film 28 is planarized to expose the fourth hard mask layer 42. The third interlayer insulating film 28 is formed with the same or similar thickness to the second dummy sacrifice layer 72, the second sacrifice layer 70 and the upper word line 40. Therefore, when the second dummy sacrifice layer and the second sacrifice layer 70 are removed in a subsequent process, the third interlayer insulating film 28 supports a side face of the upper word line 40, thereby suspending the upper word line 40 from the cantilever electrode 50. For example, the third interlayer insulating film 28 is formed including a silicon oxide layer formed through a plasma CVD. Further, the third interlayer insulating film 28 may be planarized through a chemical mechanical polishing. At this time, when the third interlayer insulating film 28 is planarized by using the upper word line 40 as an etch stop layer, the upper word line 40 formed of conductive metal layer may be damaged, thus the fourth hard mask layer 42 should be used as the etch stop layer.

Figure 19A:
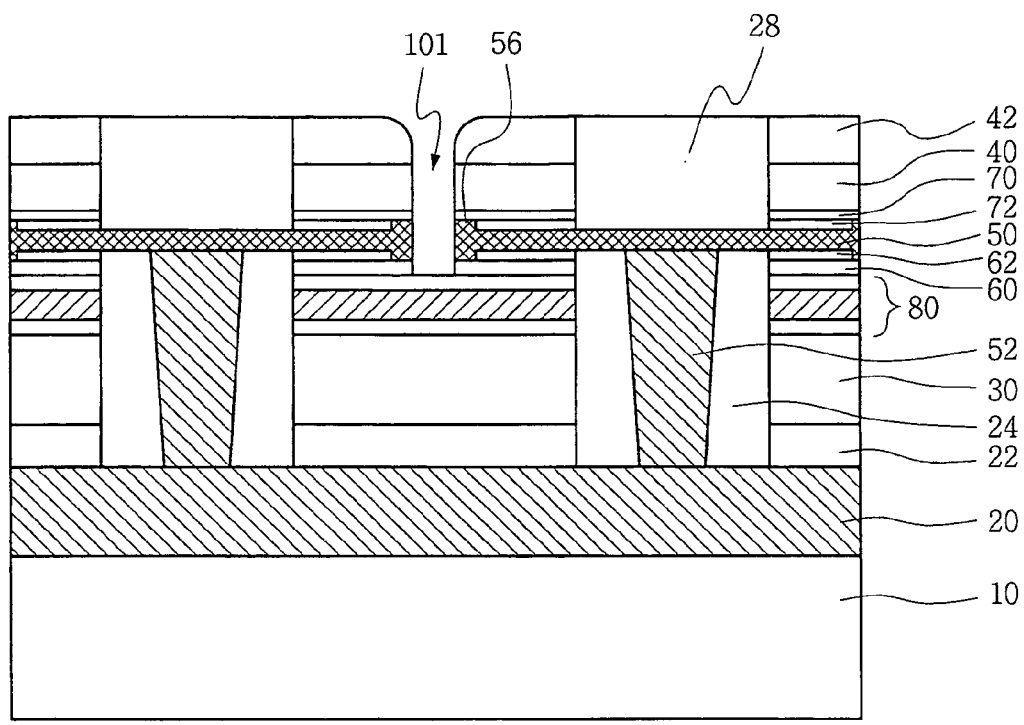
Figure 19B:
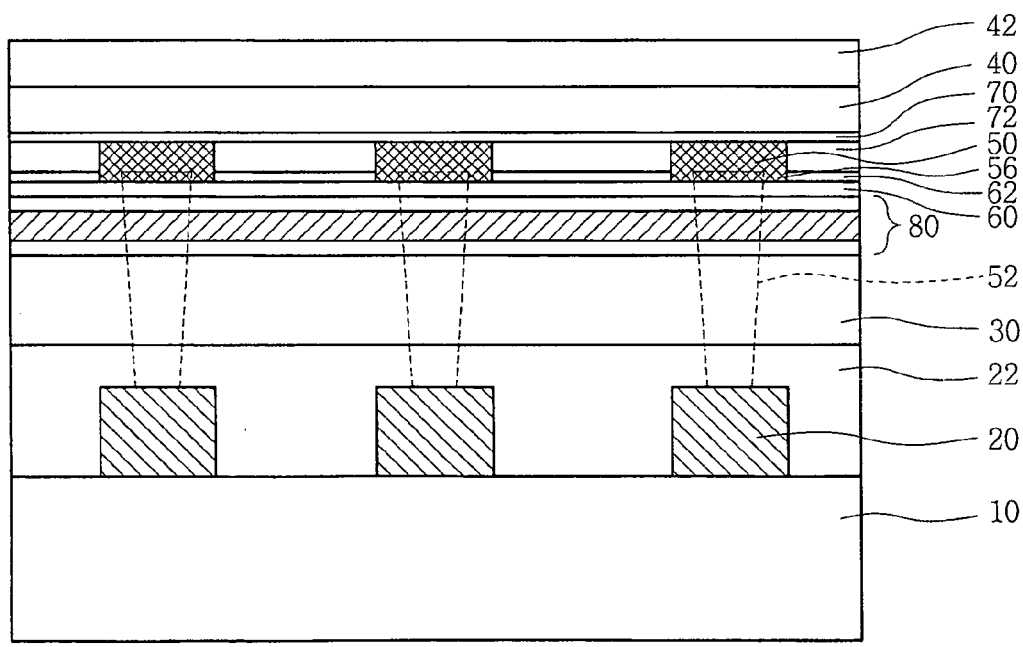

With reference to FIGS. 19A and 19B, the fourth hard mask layer 42 is etched through the dry etching method that uses a photoresist pattern as a etching mask, the photoresist pattern exposing, in a second direction, a center of the fourth hard mask 42 formed on the upper word line 40. Subsequently, the photoresist pattern is removed. The upper word line 40, second sacrifice layer 70, second dummy sacrifice layer 72, cantilever electrode 50, first dummy sacrifice layer 62 and first sacrifice layer 60 are sequentially removed through the dry etching method using the fourth hard mask layer 42 as the etching mask, thus forming a dummy trench 101, a bottom of which the trap site 80 is exposed. The dummy trench 101 is formed to separate the upper word line 40 into the first and second upper word lines in the second direction and to separate a node of the cantilever electrode 50, and furthermore to be easy to remove the first and second dummy sacrifice layers 62 and 72 and the first and second sacrifice layers 60 and 70 formed in a lower part of the fourth hard mask layer 42 and the upper word line 40. For example, reactive gas used for the dry etching method may be a gas of FC-group such as $C_xF_y$ group or $C_aH_bF_c$ group etc. The gas of FC-group may be a gas such as $CF_4$, $CHF_3$, $C_2F_6$, $C_4F_8$, $CH_2F_2$, $CH_3F$, $CH_4$, $C_2H_2$, $C_4F_6$, etc., or their mixture gas. The dummy trench 101 is formed having a predefined line width to separate symmetrically in the first direction the upper word line 40, second sacrifice layer 70, second dummy sacrifice layer 72, cantilever electrode 50, first dummy sacrifice layer 62 and first sacrifice layer 60 into first and second sides. And, in a subsequent process, etchant solution or reactive gas to isotropically eliminate the first sacrifice layer 60, first dummy sacrifice layer 62, second dummy sacrifice layer 72 and second sacrifice layer 70 formed in an upper part of the trap site 80 can easily flow through the dummy trench 101. The dummy trench 101 may be formed therein having a line width of about 30 Å to 800 Å.

Figure 20A:
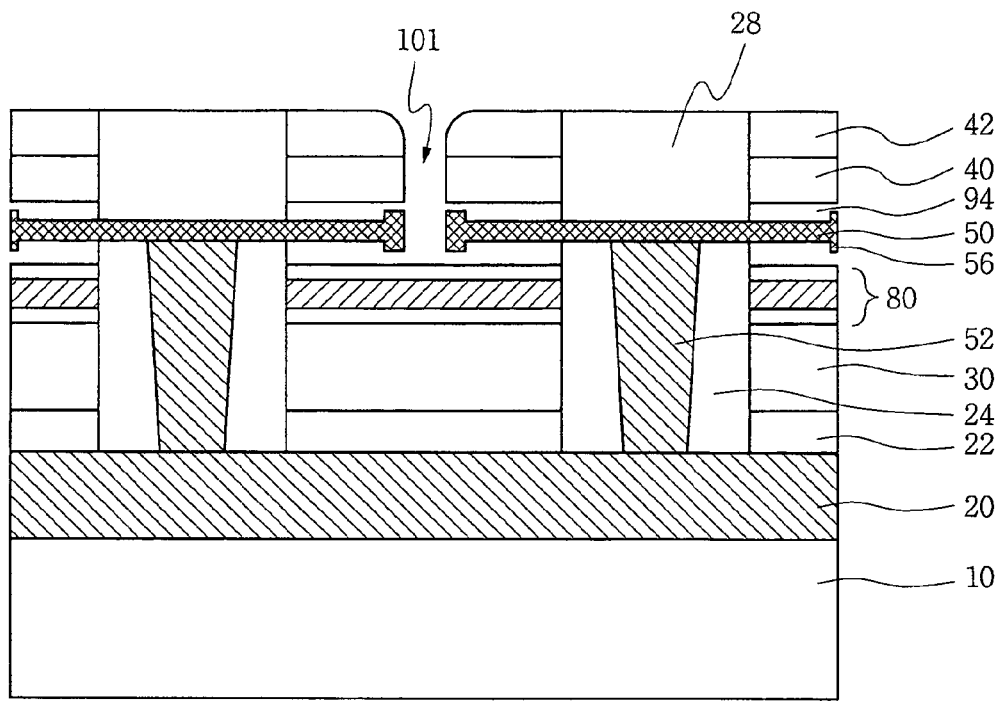
Figure 20B:
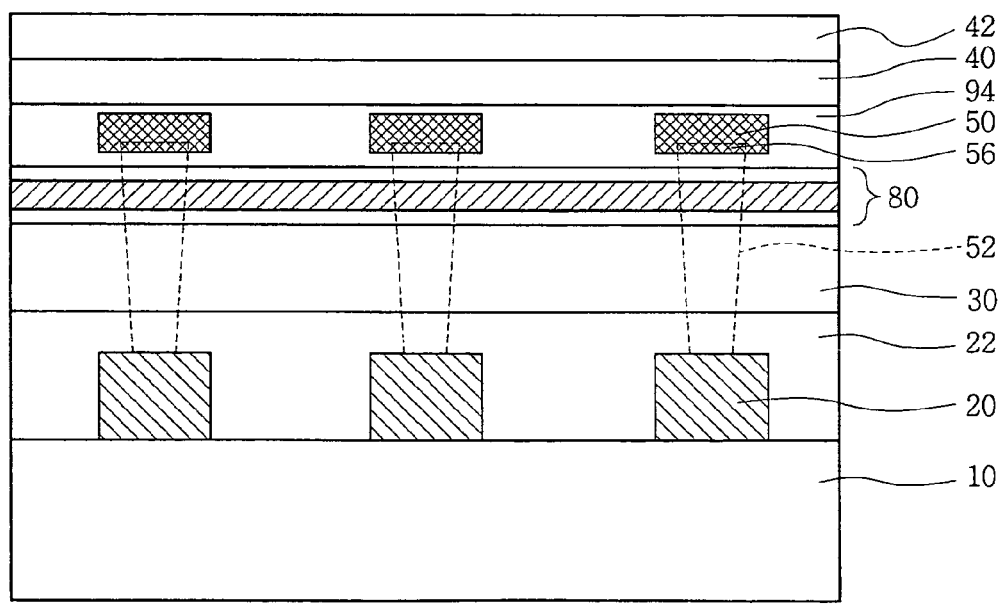

As shown in FIGS. 20A and 20B, the first sacrifice layer 60, first dummy sacrifice layer 62, second dummy sacrifice layer 72 and second sacrifice layer 70 exposed to the dummy trench 101 are removed to form voids 94 through which the cantilever electrode 50 are suspended between the lower word line 30 and the upper word line 40. For example, the first sacrifice layer 60, first dummy sacrifice layer 62, second dummy sacrifice layer 72 and second sacrifice layer 70 may be isotropically etched and removed in a side direction from a sidewall thereof exposed to the trench 100 through wet etching method or dry etching method. An etchant solution used for the wet etching method of the first sacrifice layer 60, first dummy sacrifice layer 62, second dummy sacrifice layer 72 and second sacrifice layer 70 formed of polysilicon material may be a mixture solution obtained by mixing a strong acid such as nitric acid, HF and acetic acid with deionized water by a given density. Reactive gas used for the dry etching method of the first sacrifice layer 60, first dummy sacrifice layer 62, second dummy sacrifice layer 72, and second sacrifice layer 70 may be a gas of FC-group such as $CF_4$, $CHF_3$, etc. Etchant solution or reactive gas used for the wet or dry etching method horizontally eliminates the first sacrifice layer 60, first dummy sacrifice layer 62, second dummy sacrifice layer 72, and second sacrifice layer 70 exposed to a sidewall of the trench 100, thereby forming the voids 94 between the upper and lower word lines 40 and 30.

Figure 21A:
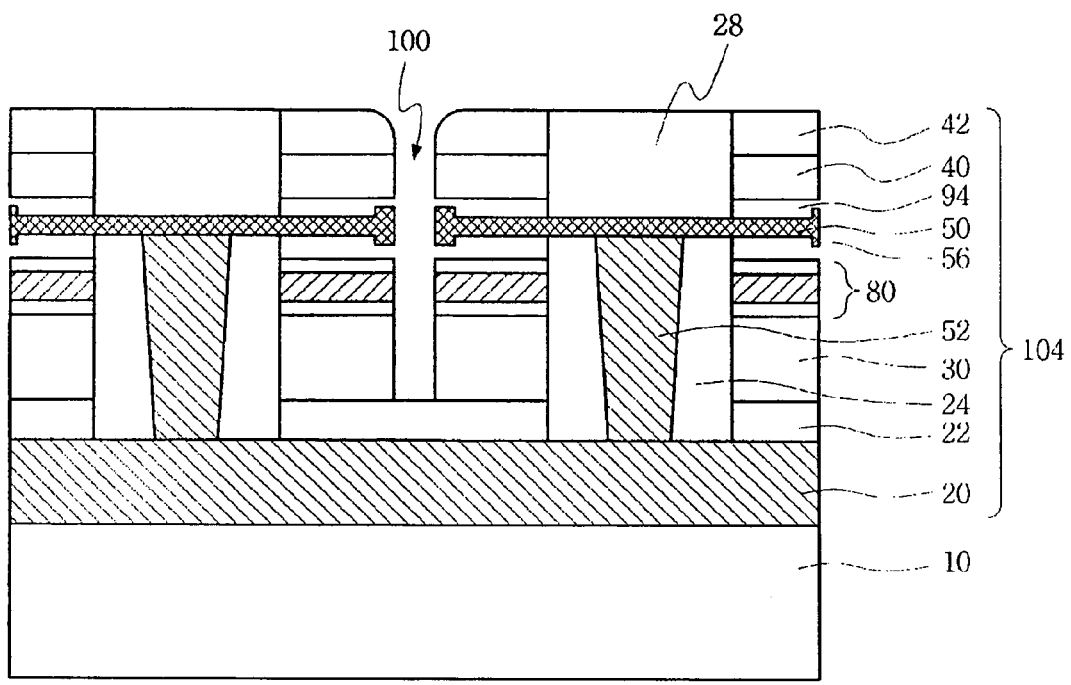
Figure 21B:
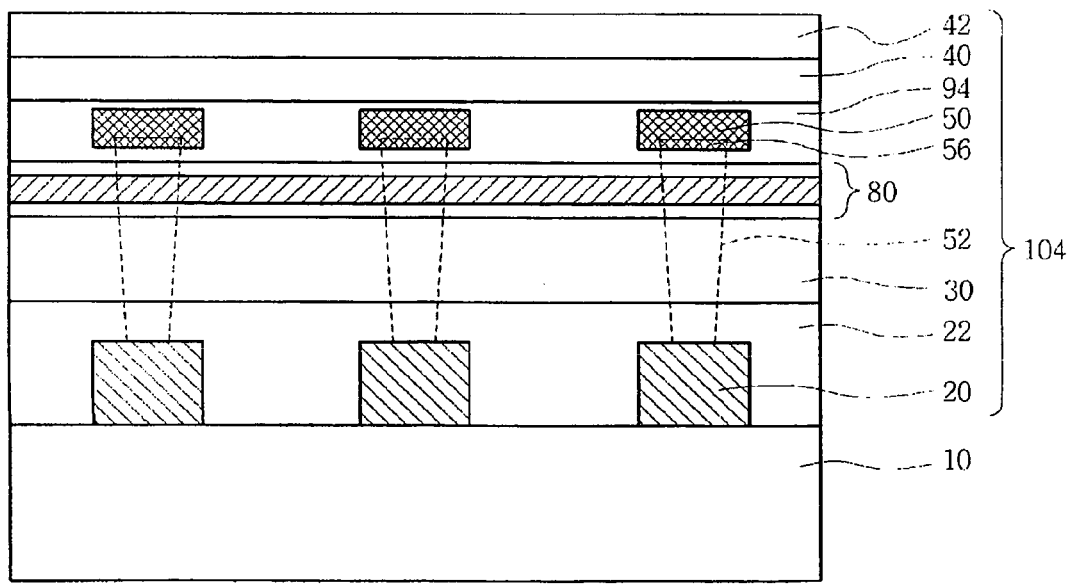

With reference to FIGS. 21A and 21B, the trap site 80 and the lower word line 30 are aeolotropically etched in the second direction to form trench 100 to which the first interlayer insulating film 22 is exposed from the bottom thereof, through the dry etching method that employs, as an etching mask, the fourth hard mask layer 42 formed on the void 94, the upper word line 40 and cantilever electrode 50. The trench 100 is formed in the second direction below the cantilever electrode 50 that the node is divided, so that the trap site 80 and the lower word line 30 are separated from each other in the first direction. The first interlayer insulating film 22 may be used as an etch stop layer in forming the trench 100 of separating the trap site 80 from the lower word line 30 through the dry etching method. The dummy trench 101, void 94 and trench 100 may each be processed and formed in-situ within one etching chamber through the dry etching method having an aeolotropy and isotropy.

Although not shown in FIGS. 21A, 21B, in an embodiment, fourth interlayer insulating film 110 (see FIG. 4) covering an upper part of the trench 100 seals or otherwise encapsulates the inside of the trench 100. In an embodiment, the void 94 inside the trench 100 can be filled with non-reactive gas such as argon or nitrogen in air, and may be determined to have a vacuum state to increase a curved speed of the cantilever electrode 50. For example, the fourth interlayer insulating film 110 is formed of polymer material that does not flow into the inside of the trench 100, but covers an upper part of the third interlayer insulating film 28 or upper word line 40 formed on the trench 100. In addition, a memory device having a multilayer structure may be manufactured by sequentially forming another bit line 20, lower word line 30, cantilever electrode 50 and upper word line 40 on an upper part of the substrate 10 on which the fourth interlayer insulating film 110 has been formed.

Consequently, in a method of manufacturing a multibit electromechanical memory device according to embodiments of the invention, plural lower word lines 30, trap sites 80, cantilever electrodes 50, contact parts 56 and upper word lines 40 can be formed symmetrically, wherein a trench 100 is formed therebetween in a second direction that intersects bit line 20 formed in a first direction on substrate 10, thereby increasing an integrated level of the memory device.

As described above, according to some embodiments of the invention, first and second contact parts are adapted protruding with a given thickness in a third direction from an end part of first and second cantilever electrodes that are coupled with a pad electrode and supported at both sides thereof by a second interlayer insulating film on the periphery of the pad electrode, thereby reducing a switching distance of the first and second cantilever electrodes, and additionally reducing a power consumption through a switching operation of the first and second cantilever electrodes at a low voltage.

In addition, first and second lower word lines are formed in a second direction and intersect a bit line above the bit line formed in a first direction, and a cantilever electrode is formed in the same first direction as the bit line, thereby configuring a matrix type cell array and so increasing an integration.

To curve the first and second cantilever electrodes in a third direction and maintain the curved state, the first and second lower word lines to which a first charge is applied, and the first and second trap sites having a stacked structure, are adapted. Therefore, the lengths of first and second cantilever electrodes are less than those of the conventional art. Further, an electrical contact portion and attractive portion applied to the conventional art can be unified by employing first and second contact parts formed from an end part of the first and second cantilever electrodes, on which a second charge is induced and concentrated in response to the first charge that is applied to the first and second lower word lines and the first and second trap sites, thereby increasing an integration of memory devices.

In addition, first and second cantilever electrodes separated into both sides on a trench or pad electrode are adapted including a unit cell that is classified as first and second memory units performing a separate switching operation; thus there is an advantage of inputting and outputting data of two or more bits each unit cell.

In the drawings and specification, there have been disclosed typical embodiments of the invention and, although specific terms are employed, they are used in a generic and descriptive sense only and not for purposes of limitation, the scope of the invention being set forth in the following claims.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A memory device comprising:
a substrate having a flat face;
a bit line formed in a first direction on the substrate;
a lower word line and a trap site that are isolated from the bit line and formed in a second direction intersecting the first direction;
a pad electrode electrically isolated from a sidewall of the trap site and the lower word line and connected to the bit line;
a cantilever electrode suspended in the first direction above a lower void and an upper part of the trap site, and connected to the pad electrode and curved in a third direction that is vertical with respect to the first and second direction by an electrical field induced by a first charge applied to the lower word line;

a contact part that concentrates a second charge induced from the cantilever electrode in response to the first charge applied to the lower word line and the trap site, the contact part protruding from an end part of the cantilever electrode, the contact part having a thickness in the third direction so as to reduce a curved distance of the cantilever electrode in the lower void; and an upper word line formed in the second direction with an upper void above the cantilever electrode.

2. The device of claim 1, wherein the contact part comprises a contact point extending from the end part of the cantilever electrode, the contact point in contact with the trap site or in electrical contact with the upper word line.

3. The device of claim 1, wherein the pad electrode is electrically isolated from the lower word line and the trap site by a second interlayer insulating film having a contact hole that extends along a sidewall of the lower word line and the trap site such that the bit line is selectively exposed by the contact hole.

4. A multibit electro-mechanical memory device, comprising:

a substrate having a flat face;

a bit line formed in a first direction on the substrate;

a first interlayer insulating film formed on the bit line;

first and second lower word lines and first and second trap sites that are formed in a second direction intersecting the bit line on the first interlayer insulating film and that are separated from each other respectively by a trench formed in the second direction;

a second interlayer insulating film covering sides of the first and second lower word lines and the first and second trap sites, the first and second lower word lines and the first and second trap sites being opposite each other by the trench;

a pad electrode in a contact hole, the contact hole being formed by removing the second interlayer insulating film provided on the sides of the first and second lower word lines and the first and second trap sites, the contact hole exposing the bit line;

first and second cantilever electrodes supported in the first direction by the second interlayer insulating film and the pad electrode, and suspended above first and second lower voids on the first and second lower word lines, and separated from each other by the trench, the first and second cantilever electrodes being curved in a third direction vertical with respect to the first and second direction by an electrical field induced by a first charge applied to the first and second lower word lines;

first and second contact parts concentrating a second charge induced from the first and second cantilever electrodes in response to the first charge applied to the first and second lower word lines and the first and second trap sites, the first and second contact parts protruding from end parts of the first and second cantilever electrodes having a thickness in the third direction so as to reduce a curved distance of the first and second cantilever electrodes in a given condition;

a third interlayer insulating film formed on the first and second cantilever electrodes corresponding to the pad electrode; and first and second upper word lines supported by the third interlayer insulating film and formed in the second direction with first and second upper voids above the first and second cantilever electrodes.

5. The device of claim 4, wherein the first and second contact parts comprise a contact point extending from the end parts of the first and second cantilever electrodes, respectively, the contact point in electrical contact with the first and second trap sites or the first and second upper word lines.

6. The device of claim 4, wherein the first and second trap sites have a stack structure of first silicon oxide layer, silicon nitride layer and second silicon oxide layer.

7. The device of claim 4, wherein the first and second cantilever electrodes contain at least one of titanium, titanium nitride and carbon nanotube.

8. The device of claim 4, further comprising first and second spacers formed in a second direction on the sides of the first and second trap sites and the first and second lower word lines opposite each other on the trench.

9. The device of claim 8, wherein the first and second spacers are exposed to the contact hole in an upper part of the bit line, and sidewalls of the first and second spacers are covered, except portions of the spacers corresponding to an upper part of the bit line, with the second interlayer insulating film.

10. The device of claim 4, wherein the trench is formed in the second direction intersected to the bit line, exposing an upper part of the first interlayer insulating film thereto.

11. The device of claim 10, comprising a fourth interlayer insulating film formed to seal the trench from an upper end of the trench.

12. A method of manufacturing a multibit electro-mechanical memory device, the method comprising:

forming a bit line in a first direction on a substrate;

forming a stack comprised of a first interlayer insulating film, lower word line, trap site, first sacrifice layer and first dummy sacrifice layer in a second direction intersected to the bit line;

forming a second interlayer insulating film filling in a sidewall of the stack, the second interlay insulating film having a contact hole to which the bit line is exposed;

forming a pad electrode inside the contact hole;

forming a cantilever electrode connected in the first direction to an upper part of the first sacrifice layer on the pad electrode and the second interlayer insulating film, the cantilever suspended above an upper part of the trap site;

forming a second dummy sacrifice layer on the cantilever electrode and the second interlay insulating film;

removing the second dummy sacrifice layer, cantilever electrode and first dummy sacrifice layer adapted in the pad electrode and so forming a dimple to which the first sacrifice layer is exposed;

filling in the dimple and so forming a contact part electrically connected to the cantilever electrode;

forming second sacrifice layer and upper word line in a second direction on the stack formed on the contact part, cantilever electrode and second interlayer insulating film;

forming a third interlayer insulating film surrounding a sidewall of the second sacrifice layer and the upper word line;

removing the upper word line, second sacrifice layer, second dummy sacrifice layer, cantilever electrode, first dummy sacrifice layer, first sacrifice layer, trap site and lower word line in the second direction, and thus forming a trench to which the first interlayer insulating film is exposed from the bottom thereof; and removing the first sacrifice layer and the second sacrifice layer exposed to the trench, and then forming voids in upper and lower parts of the cantilever electrode.

13. The method of claim 12, wherein the contact part is formed by forming a conductive metal layer of a given thickness or carbon nanotube on the second dummy sacrifice layer including the dimple and then by removing the conductive metal layer or the carbon nanotube to be planarized so as to expose the second dummy sacrifice layer.

14. The method of claim 12, wherein the second interlayer insulating film is formed by forming a silicon oxide layer burying the stack and removing the silicon oxide layer to be planarized so as to expose the first sacrifice layer, and by removing the silicon oxide layer formed on the bit line and adapted in the stack, so as to form the contact hole to which the bit line is selectively exposed in both sides of the stack.

15. The method of claim 12, wherein the pad electrode is formed by forming conductive metal or polysilicon filling in the contact hole and by removing the conductive metal or polysilicon to be planarized so as to expose the first dummy sacrifice layer and the second interlayer insulating film.

16. The method of claim 12, wherein the cantilever electrode formed on the pad electrode, second interlayer insulating film and first dummy sacrifice layer is formed with the same or similar line width to the bit line in an upper part of the bit line.

17. The method of claim 12, wherein when the first and second dummy sacrifice layers are formed of silicon germanium material and the first and second sacrifice layers are formed of polysilicon material, the polysilicon is isotropically etched and eliminated through a wet or dry etching method.

18. The method of claim 17, wherein isotropy etchant solution used for the wet etching method contains a mixture solution obtained by mixing nitric acid, HF and acetic acid with deionized water by a given density, and isotropy reactive gas used for the dry etching method contains gas of FC-group formed of $CF_4$ or $CHF_3$.

19. The method of claim 12, comprising, forming a dummy trench to expose the trap site from the bottom thereof by eliminating the upper word line, second sacrifice layer, second dummy sacrifice layer, cantilever electrode, first dummy sacrifice layer and first sacrifice layer; forming voids in upper and lower parts of the cantilever electrode by removing the first dummy sacrifice layer, second dummy sacrifice layer, first sacrifice layer and second sacrifice layer whose sidewalls are exposed to the dummy trench; and forming the trench to expose the first interlayer insulating film from the bottom thereof by removing the lower word line and the trap site exposed to the bottom of the dummy trench.

20. The method of claim 12, further comprising forming a fourth interlayer insulating film for shielding an upper end of the trench to seal up the trench.

* * * * *